(12) United States Patent
Funaba et al.

(10) Patent No.: US 7,725,778 B2
(45) Date of Patent: May 25, 2010

(54) SEMICONDUCTOR INTEGRATED CIRCUIT AND ELECTRONIC DEVICE

(75) Inventors: Seiji Funaba, Kokubunji (JP); Yoji Nishio, Higashimurayama (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/314,291

(22) Filed: Dec. 8, 2008

(65) Prior Publication Data
US 2009/0115442 A1 May 7, 2009

Related U.S. Application Data

(60) Division of application No. 11/270,608, filed on Nov. 10, 2005, now Pat. No. 7,478,287, which is a continuation of application No. 09/717,353, filed on Nov. 22, 2000, now abandoned.

(30) Foreign Application Priority Data

Dec. 27, 1999 (JP) .................... 11-368794

(51) Int. Cl.
G11B 20/20 (2006.01)
G11C 29/00 (2006.01)
G01R 31/26 (2006.01)
(52) U.S. Cl. .................. 714/700; 714/718; 324/765
(58) Field of Classification Search ............. 714/718, 714/700, 724, 798; 365/201; 324/765
See application file for complete search history.

(56) References Cited

U.S. PATENT DOCUMENTS 5,414,381 A * 5/1995 Nelson et al. ............... 327/262

| 5,430,394 A | 7/1995 | McMinn et al. |
| 5,568,081 A | 10/1996 | Lui et al. |
| 5,570,294 A | 10/1996 | McMinn et al. |
| 5,586,054 A | 12/1996 | Jensen et al. |

(Continued)

FOREIGN PATENT DOCUMENTS

| JP | 5-322981 | 5/1992 |
| JP | 6-112780 | 9/1992 |
| JP | 7-226666 | 9/1992 |
| JP | 9-307419 | 5/1996 |
| JP | 10-41803 | 7/1996 |

OTHER PUBLICATIONS

"Transition control for time-delayed systems" by Debin Sun et al. This paper appears in: American Control Conference, 1997. Proceedings of the 1997 Publication Date: Jun. 4-6, 1997 notvol. 5, on pp. 3210-3214 vol. 5.*

(Continued)

*Primary Examiner*—Cynthia Britt
(74) *Attorney, Agent, or Firm*—Stites & Harbison PLLC; Juan Carlos A. Marquez, Esq.

(57) ABSTRACT

A dummy wiring 25 is provided for simulating an actual wiring 26 connecting semiconductor integrated circuits 2 and 6 on a circuit board. The semiconductor integrated circuit comprises a data output circuit 28 capable of variably setting the slew rate and a circuit 29 for measuring signal delay time between a signal sending point and a signal reflection point (characteristic impedance mismatching point) using the dummy wiring 25, and the delay time so obtained by the measuring circuit is used for the determination of the signal transition time of the output circuit. The transition time of the signal is set at least twice of the signal delay time between the signal sending point and the wiring branch at the nearest end. In this way, signal transmission with alleviated reflection by the reflection point at the nearest end is realized.

10 Claims, 28 Drawing Sheets

U.S. PATENT DOCUMENTS

| | | | |
|---|---|---|---|
| 5,619,147 | A | 4/1997 | Hunley |
| 6,020,757 | A | 2/2000 | Jenkins, IV |
| 6,052,810 | A | 4/2000 | Creek |
| 6,072,729 | A | 6/2000 | Casper |
| 6,081,916 | A | 6/2000 | Whetsel, Jr. |
| 6,133,725 | A | 10/2000 | Bowhers |
| 6,184,708 | B1 | 2/2001 | Jenkins, IV |
| 6,288,563 | B1 | 9/2001 | Muljono et al. |
| 6,324,666 | B1 | 11/2001 | Nakamoto |
| 6,622,103 | B1 * | 9/2003 | Miller .......................... 702/89 |

OTHER PUBLICATIONS

C. H. Lim et al., "Output Buffer with Self-Adjusting Slew Rate and On-Chip Compensation", IEEE Symposium on IC/Package Design Integration, Publication Date Feb. 2-3, 1998, pp. 51-55, Inspec Accession No. 6039708.

F. Garcia et al., "Design of a Slew Rate Controlled Output Buffer", Eleventh Annual IEEE International ASIC Conference Proceedings, Publication Date Sep. 13-16, 1998, pp. 147-150. Inspec Accession No. 6161761.

JPO Office Action dated May 9, 2007 in Japanese and English.

"Group Delay Caused by Impedance Mismatch" by Lanzinger, Donald J. this paper appears in: ARFTG Conference Digest-Spring, $29^{th}$ Publication Date: Jun. 1987 vol. 11, on pp. 247-264 ISBN: 0-7803-5686-1.

"ASIC system design considerations" by Shastry ASIC Conference and Exhibit, 1993, Proceedings: Sixth Annual IEEE International Publication Date: Sep. 27-Oct. 1, 1993 On pp. 294-296 Meeting Date: Sep. 27, 1993-Oct. 1, 1993 ISBN: 0-7803-1375-5 INSPEC Accession No. 4985825.

* cited by examiner

OUTPUT SLEW RATE 8V/ns (tr=0.25ns)

OUTPUT SLEW RATE 2.4V/ns (tr=0.9ns)

ADJUSTMENT TO THE SLEW RATE
OF OUTPUT CIRCUIT 94

ADJUSTMENT TO THE SLEW RATE
OF OUTPUT CIRCUIT 95

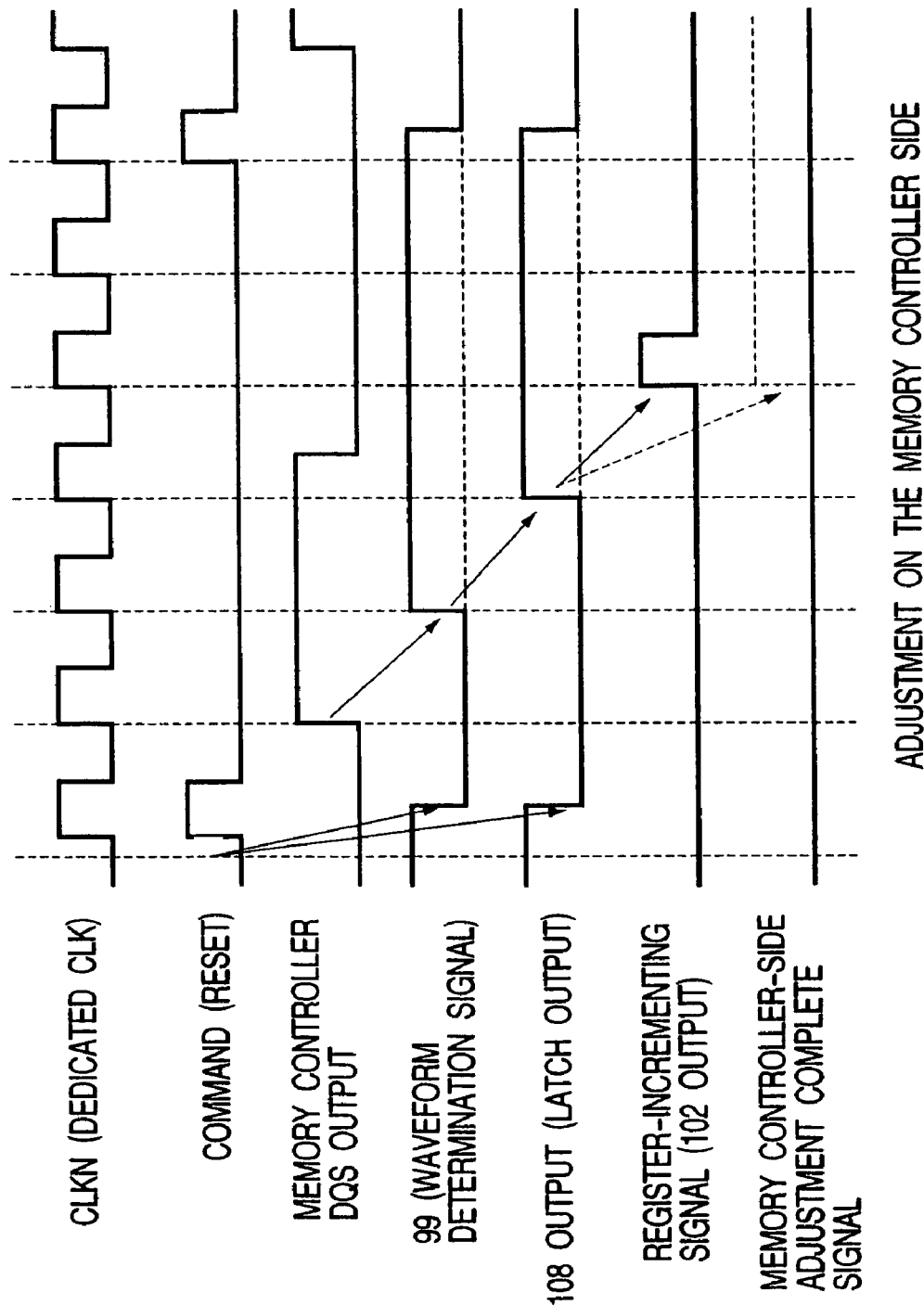

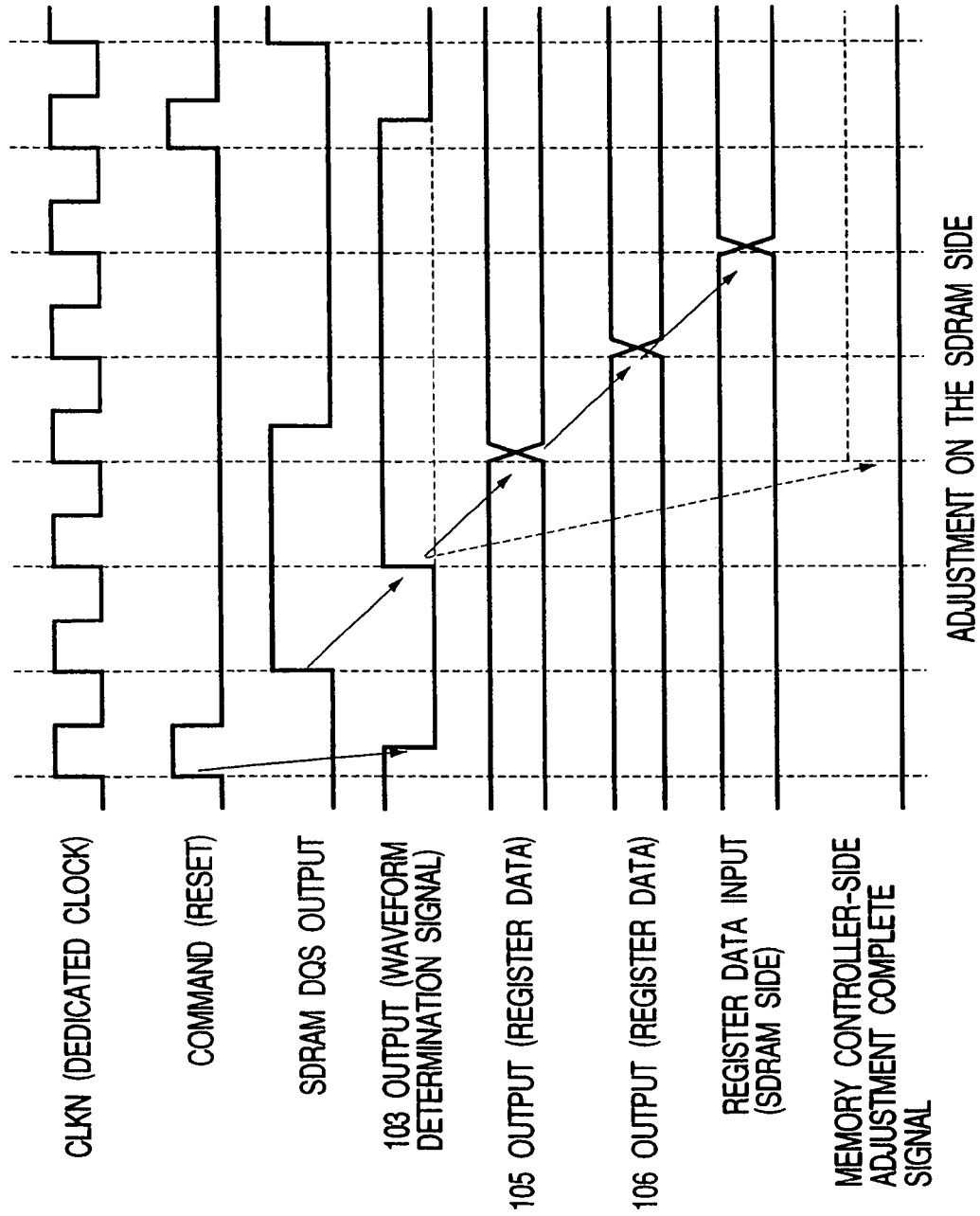

ADJUSTMENT TO THE SLEW RATE
OF OUTPUT CIRCUIT 94

ADJUSTMENT TO THE SLEW RATE
OF OUTPUT CIRCUIT 95

SEMICONDUCTOR INTEGRATED CIRCUIT AND ELECTRONIC DEVICE

CROSS REFERENCE TO RELATED APPLICATIONS

This application is a Divisional of U.S. application Ser. No. 11/270,608 filed Nov. 10, 2005, now U.S. Pat. No. 7,478,287 which is a Continuation of nonprovisional U.S. application Ser. No. 09/717,353 filed Nov. 22, 2000. now abandoned. Priority is claimed based on U.S. application Ser. No. 11/270,608 filed Nov. 10, 2005, which claims the priority of U.S. application Ser. No. 09/717,353 filed Nov. 22, 2000, which claims the priority of Japanese application 11-368794 filed on Dec. 27, 1999.

BACKGROUND OF THE INVENTION

The present invention relates to a technique to alleviate reflection of signals caused by discontinuity or mismatch of characteristic impedances in signal transmission lines and ringing induced thereby, and more particularly to a technique effective when applied to semiconductor integrated circuits, electronic devices, memory modules, and motherboards mounted with memory modules.

Due to the maximization of operation speed and the minimization of power and voltage levels in semiconductor devices, there is a trend that the amplitudes of signals transmitted between semiconductor devices are further reduced from those of TTL interfaces. This would increase the relative magnitude of impact from the effect of reflection occurred during signal transmission between semiconductor devices, resulting in increased likelihood of such semiconductor devices to miscomprehend the logic values of the transmitted signals. This would lead to the degradation in the operational reliability of semiconductor devices or electronic devices, which in turn, would be detrimental to the maximization of the operating speed of such semiconductor devices.

As one of the prior art technologies, there is one disclosed in Japanese Patent Laid-Open No. 10-41803/1998, which takes note of such impedance mismatch. The disclosure of which pays attention to the output impedance of a semiconductor device itself, which is one of the factors for impedance matching. That is, it is difficult to give uniformity to the output impedances of semiconductor devices due to process variability etc. Even if such uniformity could be achieved, there still is a possibility of the occurrence of mismatch due to the inductance components of packages or printed boards. Accordingly, the aforementioned disclosure relates to an invention which provides the controllability over the number of the final output stage transistors of an output circuit. There is also another known circuit which is disclosed as an output buffer in Japanese Patent Laid-Open No. 9-307419/1997.

SUMMARY OF THE INVENTION

It is generally believed that, when a transmission line having a finite length is terminated with a load equal to its characteristic impedance, then voltage waves and current waves would be transmitted in a manner analogous to that of a transmission line having an infinite length. Such an impedance matching approach would be able to limit the occurrence of ringing in signal waveforms (decrementally oscillated distortion) caused by voltage reflection etc. in a transmission line.

However, the transmission lines of electronic devices etc. are often shared by a large number of circuits or devices by being branched in a complicated pattern by various bus connections, and many of them employ configurations in which daughter boards and memory modules are mounted on a motherboard. Therefore, it is easily understood that there would be many characteristic impedance mismatching points at the branches and connection points of connectors along the transmission lines. Given this condition, if the impedance matching is of the highest priority, it may be addressed by providing a stub resistance or termination resistance at each of the characteristic impedance mismatching points. However, the inventor of the present invention discovered that such provision of resistances at various many points would result in undesirable signal transmission delays and signal attenuation, so that it would rather make more difficult to realize an accelerated operating speed with a small signal amplitude. That is, the inventor of the present invention discovered that there is a limit to the extent of the perfection of impedance matching, giving considerations to the facts; operating speed being accelerated, scales of electronic devices being expanded, systems being further sophisticated, buses and circuit boards being constructed in hierarchical architectures, and devices and circuit boards having production errors and different thermal properties etc.

The inventor of the present invention took note of slew rates of semiconductor devices. As used herein, a term "slew rate" is understood in terms of a rate of change of output voltage per a signal transition time, or unit time. A slew rate for a semiconductor device may vary by manufacturing variability, power-supply voltage, ambient temperature etc. The inventor of the present invention carried out a simulation of a particular implementation of an SSTL interface. According to the simulation, when the slew rate was set at i.e. 8V/ns (rise time 0.25 ns), ringing was observed in the transmission waveform, but when the slew rate was reduced to 2.4V/ns (rise time 0.9 ns), the ringing in the transmission waveform was alleviated. The inventor of the invention found that this ringing had been caused by the signal reflection on the wirings of the implementation. When this ringing becomes stronger, it is possible for a device to make mistakes in determining timing instructions or logic values. For example, when relatively large ringing occurs to a data strobe signal for the data which is transmitted in a high speed, it is well possible that malfunctions are induced in the transmission and reception of the data.

The level of this ringing (level of reflection) varies depending on the conditions of the implementation, so that a semiconductor device having a fixed slew rate would not be readily applicable to a wide variety of implementations, from those which are susceptible to ringing (likely to produce reflection) to those which are not (unlikely to produce reflection).

The aforementioned Japanese Patent Laid-Open No. 307419/1997 describes an open drain buffer in which a slew rate of the leading edge of a waveform may be variably set, from the understanding that each user employs a different transmission rate and a different number of branches. In this buffer, the slew rate can be reduced by increasing the operation delay of a circuit which controls the switching of open drain transistors, and the slew rate can be increased by reducing the operation delay of that circuit.

However, in the above prior art, a controller is provided for generating control voltage for the open drain transistors, and this controller is configured to determines the slew rate based on the result of the detection of an ambient temperature condition and process conditions in which the circuit operates, so that it does not automatically control the slew rate according to the conditions of the implementation. In light of the above discussion by the present inventor, given a requirement demanding high-speed operation with a small signal amplitude, it is difficult to realize the perfect matching of the impedances, and in order to eliminate, beforehand, the risk of malfunctioning in data transmission under such conditions, it is necessary to allow the slew rate to be controllable according to the condition of the implementation.

An object of the present invention is to provide semiconductor integrated circuits and electronic devices that are capable of controlling and suppressing the ringing generated on the transmission lines according to the conditions of the implementation even when they are operated at a high speed with small signal amplitudes.

Another object of the present invention is to provide semiconductor integrated circuits and electronic devices that are capable of alleviating the errors in determining timing instructions carried by signals on the transmission lines or logic values of the signals regardless of the conditions of the implementation.

Still another object of the present invention is to provide semiconductor integrated circuits and electronic devices that are capable of automatically controlling the slew rates according to the conditions of the implementation.

The above and additional objects and novel features of the present invention will be apparent to those skilled in the art by reviewing the following detailed description of the invention in conjunction with the attached figures.

Among those disclosed herein, one representative invention may be summarized as follows.

The present invention is a semiconductor integrated circuit or an electronic device having a function to suitably control the slew rates of output signals according to the conditions of the implementation or signal transmission system.

The first invention, in this context, has a data output circuit of variable slew rate, and uses a dummy wiring which replicates an actual wiring in the implementation to measure a signal delay time between a signal sending point and a signal reflection point, and by using the obtained delay time, determines the slew rate of the signal to be sent out. For example, the transition time of the signal is set to, at least twice of the signal delay time from the signal sending point to a wiring branch at the nearest end.

In the first invention, since the signal delay time from the signal sending point to the reflection point (i.e. wiring branch at the nearest end) is measured by using the dummy wiring, and the slew rate is set to at least twice of the signal delay time, signal transmission with alleviated reflection from the reflection point at the nearest end, is possible. Moreover, by providing a dummy wiring for a reflection point which corresponds to the target reflection to be alleviated, it is possible to obtain a slew rate which alleviates the reflection at any arbitrary reflection point.

The second invention includes a data output circuit of variable slew rate, and a means for detecting fluctuations in waveforms on its signal receiving side, and when a fluctuation is detected, it alleviates the slew rate of the signal sending side until the fluctuation of the waveform is no longer detected.

In the second invention, the fluctuation of the waveform (hazard) is detected at the signal receiving side, and the slew rate is alleviated until such fluctuation ceases, thereby allowing the signal transmission without fluctuation in waveforms at the signal receiving side in the actual operation.

The third invention includes a data output circuit of variable slew rate, and performs data transmitting/receiving tests. When any errors are found, it alleviates the slew rate until the errors are no longer detected. In this manner, signal transmission in which the occurrence of transmitting/receiving errors is reduced or suppressed in the actual operation.

Since any one of the above first through third inventions allows signal output with a suitable slew rate for the implementation, stable data transmission may be realized in the wide variety of implementations. Furthermore, the reliability of semiconductor integrated circuits and electronic devices would not be substantially affected by the implementation requirements. In other words, they are applicable to the wide range of the implementation requirements.

BRIEF DESCRIPTION OF THE DRAWINGS

FIG. 20 is a timing chart of an exemplary slew rate setting operation on the memory controller side.

FIG. 21 is a timing chart of an exemplary slew rate setting operation on the SDRAM side.

DETAILED DESCRIPTION OF THE INVENTION

Figure 1:
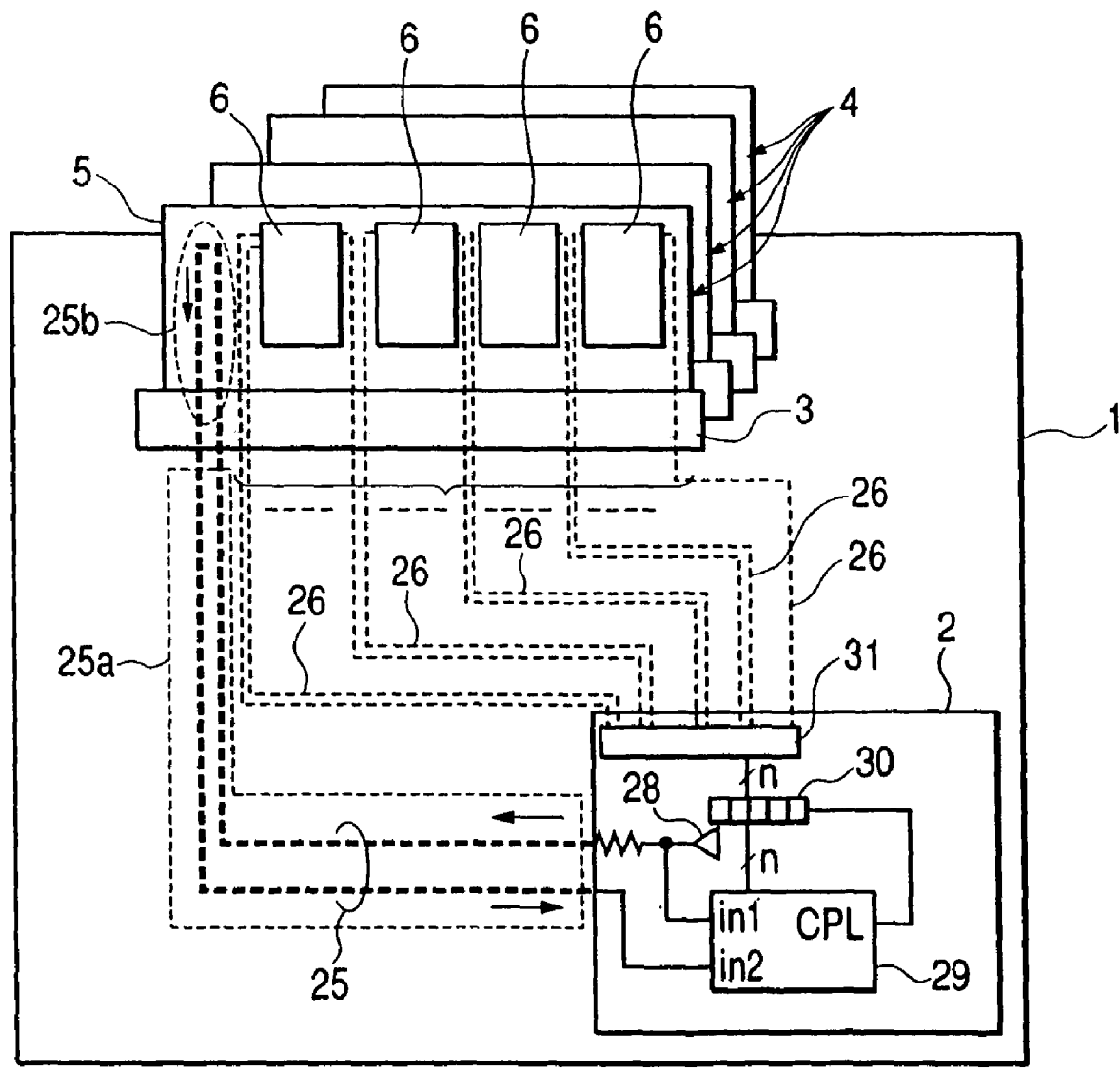
FIG. 1 is a block diagram showing an exemplary arrangement of a memory controller to optimize the slew rate of its output circuit.

Following describes in detail, the modes of the above first through third inventions.

1. First Invention

<Semiconductor Integrated Circuit>

A semiconductor integrated circuit pertinent to the first invention comprises an output circuit capable of variably setting signal transition time, a signal generating circuit for generating a test signal for the use in an operation of setting the signal transition time, and an output pin for externally outputting the test signal, wherein the signal transition time for the output circuit is set based on the test signal outputted from the output pin.

As for the means for setting the signal transition time, the semiconductor integrated circuit may include a controlling means to which the test signal outputted from the output pin is fed back and input, the controlling means determining the delay time of the inputted test signal relative to the test signal outputted from the output circuit, and setting the signal transition time of the output circuit based on that determination result.

When the semiconductor integrated circuit is a memory, and the output circuit outputs, for example, data read out from memory cells, then this output circuit is a circuit for outputting data strobe signals for the external output of write data.

When the semiconductor integrated circuit is a memory controller performing interface control of data, address signals and strobe signals necessary for memory access in response to memory access instructions, the output circuit is a circuit outputting data strobe signals for the output of write data.

<Electronic Device>

In an electronic device, which is an invention seen as including the above semiconductor integrated circuit and the implementation thereof, a plurality of semiconductor integrated circuits connected to signal wirings are mounted on a circuit board. At least one among the signal wirings is a dummy wiring which simulates and feeds back the path from a given semiconductor integrated circuit to a given characteristic impedance mismatching point located along the signal wiring reaching to a different semiconductor integrated circuit. The given semiconductor integrated circuit comprises an output circuit capable of variably setting signal transition time, a signal generating circuit for generating a test signal for the use in a setting operation of the signal transition time, an output pin for outputting the test signal to the dummy wiring, and a controlling means for receiving the input of the test signal that has been fed back from the dummy wiring, and setting the signal transition time for the output circuit based on the delay time of the inputted test signal relative to the test signal outputted from the output pin.

In an electronic device which recognizes a connector of a motherboard and a daughter board such as a memory module, as a characteristic impedance mismatching point, a plurality of semiconductor integrated circuits connected to the signal wirings are mounted on a circuit board. At least one among the signal wirings is a dummy wiring which simulates and feeds back the path from a given semiconductor integrated circuit to a given characteristic impedance mismatching point located along the signal wiring reaching to a different semiconductor integrated circuit. That given semiconductor integrated circuit comprises an output circuit capable of variably setting signal transition time, a signal generating circuit for generating a test signal for the use in a setting operation of the signal transition time, an output pin to output the test signal to the dummy wiring, and a controlling means for receiving the input of the test signal that has been fed back from the dummy wiring, and setting the signal transition time for the output circuit based on the delay time of the inputted test signal relative to the test signal outputted from the output pin.

In terms of the motherboard, the semiconductor integrated circuit is a memory controller which performs interface control of the data, address signals and strobe signals that are necessary for memory access in response to memory access instructions, and the connector is a connector to which memory modules are attached. In this case, the output circuit is a circuit outputting, for example, data strobe signals for the output of write data.

From the viewpoint of the memory module, the semiconductor integrated circuit is one of a plurality of memory chips constituting a memory module, and the connector is a connector externally connecting each of the memory chips so as the chips are accessible. In this case, the output circuit is a circuit outputting, for example, data strobe signals for the external output of the data read out from the memory chips.

In a context where the memory modules and the memory controller respectively performs the delay time measurements for setting the signal transition time, the electronic device would include a motherboard mounted with a memory controller and memory modules interfaced by the memory controller, each mounted with a plurality of memories. The electronic device includes a first dummy wiring which simulates and feeds back the path from a memory to a given characteristic impedance mismatching point located along the signal wiring reaching to the memory controller, and a second dummy wiring which simulates and feeds back the path from the memory controller to a given characteristic impedance mismatching point located along the signal wiring to the memory. A memory includes a first output circuit capable of variably setting signal transition time, a first signal generating circuit for generating test signals for the use in the setting operation of the signal transition time, and a first controlling means for setting the signal transition time for the first output circuit based on the transmission delay time of a test signal that has been outputted to the first dummy wiring from the first signal generating circuit and fed back. The memory controller includes a second output circuit capable of variably setting signal transition time, a second signal generating circuit for generating test signals for setting the signal transition time, and a second controlling means for setting the signal transition time for the second output circuit based on the transmission delay time of a test signal that has been outputted to the second dummy wiring from the second signal generating circuit and fed back.

In a context where the memory controller performs the delay time measurement for setting the signal transition time for the memory module, the electronic device includes a motherboard having a memory controller mounted thereon and memory modules, each having a plurality of memories mounted thereon and interfaced through a connector to the memory controller. The electronic device has a first dummy wiring which simulates and feeds back the signal wiring path from the memory controller to a memory, and a second dummy wiring which simulates and feeds back the signal wiring path from the memory controller to the connector. A memory includes a first output circuit capable of variably setting signal transition time. The memory controller has a second output circuit capable of variably setting signal transition time, a signal generating circuit for generating test signals for the use in the setting operation of the signal transition time, a second controlling means for setting the signal transition time for the second output circuit based on the transmission delay time of a test signal that has been outputted to the first dummy wiring from the signal generating circuit and fed back, and a first controlling means for determining the signal transition time for the first output circuit based on the difference between the transmission delay time of a test signal which has been outputted to the first dummy wiring from the signal generating circuit and fed back and the transmission delay time of a test signal which has been outputted to the second dummy wiring from the signal generating circuit and fed back.

2. Second Invention

<Semiconductor Integrated Circuit>

A semiconductor integrated circuit pertinent to the second invention comprises an output circuit capable of variably setting the rate of change in output voltage per unit time and a test output controlling circuit for controlling the output circuit to output test signals to be used for the setting operation of the rate of change, wherein the rate of change is set for the output circuit based on the result returned from the outside of the circuit in response to a test signal outputted from the output circuit.

The means for setting the rate of change of the output voltage receives the input of an external signal returned in response to the test signal outputted from the output circuit. This inputted signal may be a detection result such as ringing in the waveform of the test signal or any controlling information etc. for reducing or offsetting the fluctuation of the waveform associated with the detection result. The semiconductor integrated circuit may include a change-of-rate controlling circuit for controlling the rate of change in the output voltage of the output circuit to be reduced by a given amount according to the state of the above input signal.

When the semiconductor integrated circuit is a memory, and, for example, data read out from a memory cell is to be externally output, the output circuit is a circuit for outputting data strobe signals for the external output of the data.

When the semiconductor integrated circuit is a memory controller performing interface control of data, address signals and strobe signals necessary for memory access in response to memory access instructions, the output circuit is a circuit outputting data strobe signals for the output of write data.

<Electronic Device>

In an electronic device, which is an invention seen as comprising the semiconductor integrated circuit and the implementation thereof, first and second semiconductor integrated circuits are mounted on a circuit board. The first semiconductor integrated circuit includes an output circuit capable of variably setting the slew rate, a test output controlling circuit for controlling the output circuit to output test signals to be used for the setting operation of the slew rate to a first signal line, and a slew rate controlling circuit for controlling the slew rate of the output circuit to be alleviated according to the state of the signal returned through a second signal line from the outside of the circuit in response to a test signal outputted from the output circuit. The second semiconductor integrated circuit includes a determination circuit for determining whether the test signal supplied through the first signal line has fluctuation in the waveform, and having a signal corresponding to that determination result outputted to the second signal line.

In an electronic device, which places emphasis on memory modules etc., a plurality of semiconductor integrated circuits and test circuits are mounted on a daughter board. The semiconductor integrated circuit has an output circuit capable of variably setting the slew rate, a test output controlling circuit for controlling the output circuit to output a first test signal to be used for a slew rate setting operation to a first signal line, and a slew rate controlling circuit for controlling the slew rate of the output circuit so as to alleviate the slew rate according to the state of a signal returned from the outside of the circuit via a second signal line in response to the first test signal which has been outputted from the output circuit. The test circuit includes a determination circuit for determining whether the second test signal supplied from the outside of the circuit through the first signal line has fluctuation in its waveform, and having a signal corresponding to that determination result outputted to a third signal line.

In an electronic device in a context where crosstalks are utilized for the waveform measurement, a first dummy wiring and a second dummy wiring are provided in parallel on a circuit board mounted with semiconductor integrated circuits. The semiconductor integrated circuit includes an external output circuit capable of variably setting the slew rate, a test output control circuit for controlling the output circuit to output test signals for the use in the slew rate setting operation to the first dummy wiring, a driving circuit coupled to the second dummy wiring for applying a given level, and a slew rate controlling circuit for controlling the slew rate of the output circuit so as to alleviate the slew rate according to the state of noise on the second dummy wiring caused by the crosstalk from the first dummy wiring.

3. Third Invention

A semiconductor integrated circuit pertinent to the third invention includes an output circuit capable of variably setting the rate of change in output voltage per unit time, and test data output controlling circuit for controlling the output circuit to output test data for the use in the setting operation of the rate of change, wherein the rate of change is set for the output circuit based on the result of comparison between test data outputted from the output circuit and expected value data.

The means for setting the rate of change in the output voltage receives the input of, for example, the result of the comparison between the test data outputted from the output circuit and the expected value data outside of the circuit, or the presence or absence of error data, and controls the rate of change of the output circuit so as to reduce the rate of change by a given amount according to the state of the inputted signal.

The means for setting the rate of change in the output voltage determines errors by comparing the test data which has been externally outputted from the output circuit and then inputted from the input circuit, with the expected value data, and controls the rate of change in the output voltage so as to reduce it by a given amount according to the determination result of the data error.

When the semiconductor integrated circuit is a memory, for example, if the data read out from a memory cell is to be externally outputted, the output circuit is a circuit for outputting data strobe signals for the external output of the data.

When the semiconductor integrated circuit is a memory controller performing interface control of data, address signals and strobe signals necessary for memory access in response to memory access instructions, the output circuit is then a circuit for outputting data strobe signals for the output of write data.

<Electronic Device>

An electronic device, which is an invention seen as comprising the semiconductor integrated circuits and the implementation thereof, has an expected value pattern generating circuit and a determination circuit external to the slew rate setting circuit in the first aspect of the invention. That is, the electric circuit has first and second semiconductor integrated circuits mounted on a circuit board. The first semiconductor integrated circuit includes an output circuit capable of variably setting the slew rate, a test data output controlling circuit for controlling the output circuit to output test data for the use in the slew rate setting operation to a first signal line, and a slew rate controlling circuit for controlling the slew rate of the output circuit so as to alleviate the slew rate according to the state of an external signal returned via the second signal line based on the result of the comparison between the test data which has been outputted from the output circuit and expected value data at the outside of the circuit. The second semiconductor integrated circuit a generating circuit generating the expected value data for the test data supplied from the first signal line, and a determination circuit for performing comparison between the test data and the expected value data and having a signal corresponding to the result of the comparison output to the second signal line.

The electronic device in the second aspect of the invention includes an expected value pattern generating circuit and a determination circuit on the side of the circuit to which the slew rate is to be set. That is, the electronic device has first and second semiconductor integrated circuits mounted on a circuit board. The first semiconductor integrated circuit includes an output circuit capable of variably setting the slew rate, an input circuit for inputting from the outside, the test data which has been externally outputted from the output circuit, a determination circuit for determining data errors by comparing the test data inputted from the input circuit with expected value data, and a slew rate control circuit for controlling the slew rate of the output circuit so as to alleviate the slew rate according to the result of the error determination. The second semiconductor integrated circuit includes a memory cell array which is enabled for the writing of the test data outputted from the output circuit, or enabled for the reading out of the data to the input circuit in response to an access request from the first semiconductor integrated circuit.

Embodiments

<Variable Control of Slew Rate>

Figure 3:
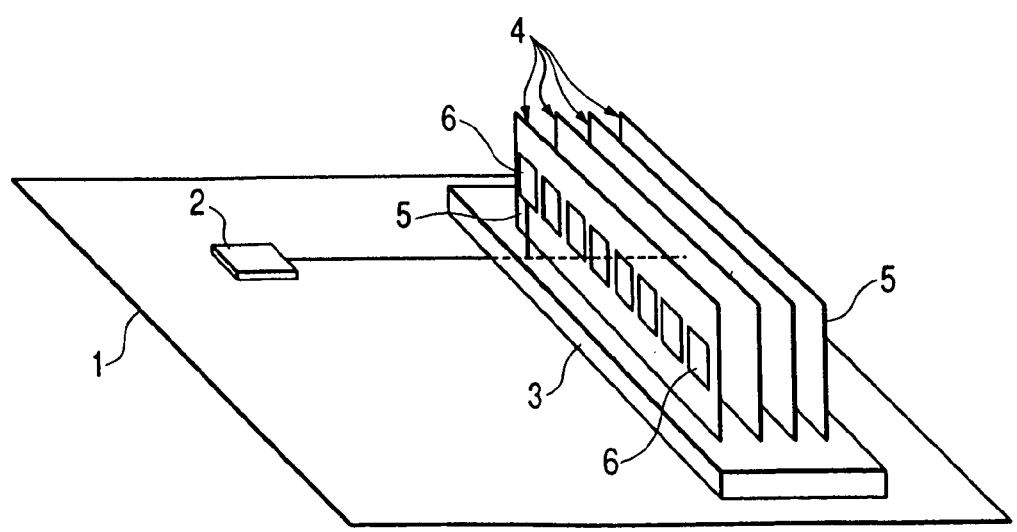
FIG. 3 is a perspective view of an exemplary electronic device relevant to the present invention, illustrating the memory controller and SDRAMs in their mounted state.

FIG. 3 shows a memory controller and SDRAMs (Synchronous Dynamic Random Access Memories) in a mounted state as one example of the electronic device pertinent to the present invention. The memory controller 2 is mounted on a motherboard 1, and a connector 3 connected to this memory controller 2 constitutes memory slots. To this connector 3, i.e. four pieces of memory modules 4 are inserted. Each of the memory modules 4 is constituted by a module substrate 5 as a daughter board and a plurality of SDRAMs 6 mounted thereon. Although it is not shown in the figure, the motherboard 1 also includes semiconductor devices such as microprocessors and DMAC etc. that are the main bodies accessing the SDRAMs 6, connected to the memory controller 2 via buses. For example, SDRAMs 6 are high-speed memories operated in synchronization with the clock and are used as the main memory of a microprocessor. The memory controller 2 performs the interface control of addresses, data, commands and strobe signals for accessing the SDRAMs 6 in response to access requests from the microprocessor.

Figure 4:
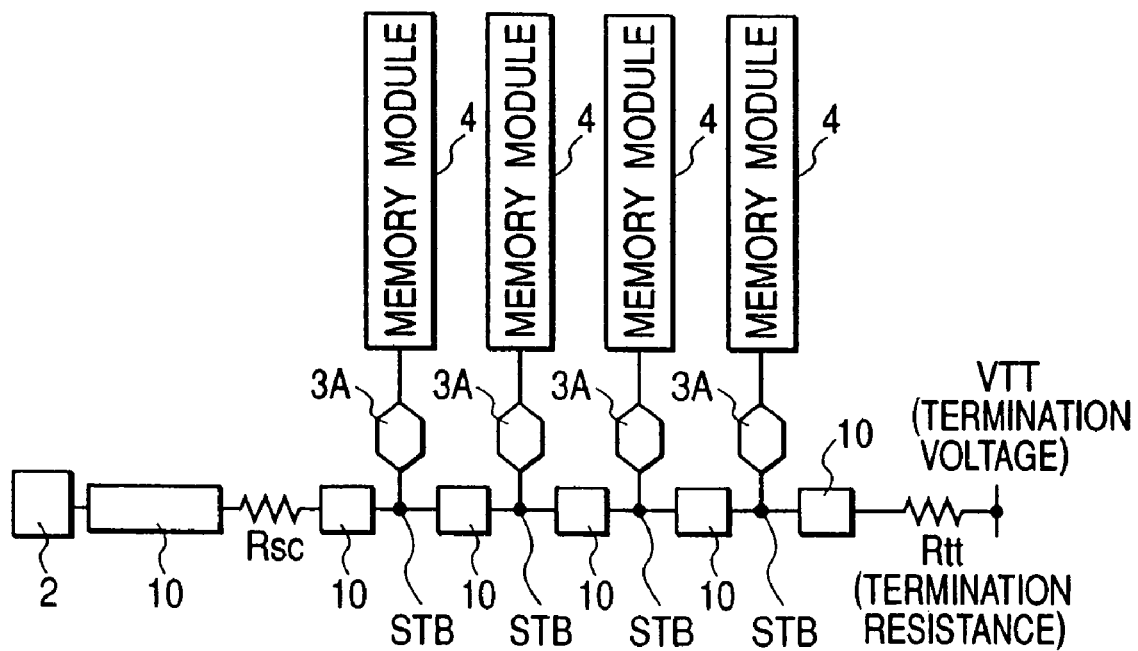
FIG. 4 is an illustrative diagram showing signal transmission system between the memory controller and memory modules, for one signal as a representative example.

FIG. 4 illustrates the signal transmission system between the memory controller and the memory module for one representative signal. The signal interface in this signal transmission system is SSTL (Stub Series Terminated Transceiver Logic) which is a small amplitude interface for memory modules. For example, according to the standard of signals in SSTL2 (Class 2), any levels of voltage equal to or greater than 1.6V, which is higher than VTT=1.25V by 0.35V or more, are considered as being in the high (H) level, and any levels lower than VTT by 0.35V or more, in other words, 0.90V or lower, are considered as being in the low (L) level.

In FIG. 4, the reference numeral 10 is a transmission line (board wiring) having a characteristic impedance of 50%, formed on the motherboard 1. The transmission line 10 extends from the memory controller 2, and it is sequentially connected to the memory modules 4 by serial connections via the pins (connector pins) 3A of the connector 3, then to a termination voltage VTT via a termination resistance Rtt.

Figure 5:
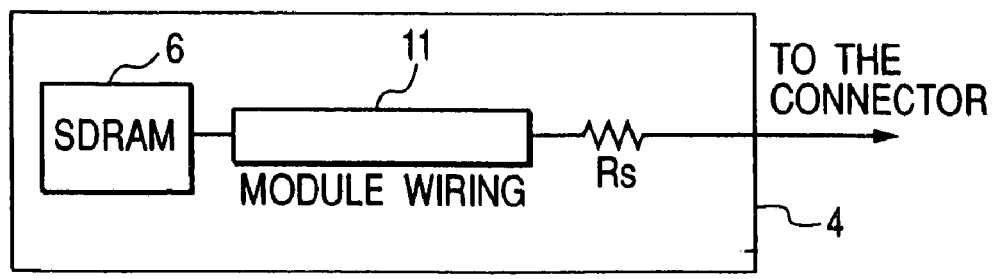
FIG. 5 is an illustrative diagram showing a stub resistance within a memory module and the state of the wiring in the module.

Since the stubs STB from the transmission line 10 to the connector pins 3A constitute characteristic impedance mismatching points, stub resistances Rsc are provided on the memory controller 2 side for the purpose to suppress the voltage reflection at the stub STB, and as shown in FIG. 5, a stub resistance Rs is also provided to the module wiring 11 of the each memory module 4 beforehand. It is difficult to achieve perfect impedance matching in the transmission lines 10, 11 only by the termination resistance Rtt and stub resistances Rsc and Rs, and the provision of many more stub resistances in attempting to achieve the perfect matching would rather result in the excessive attenuation of signal for such a small amplitude SSTL.

Figure 6:
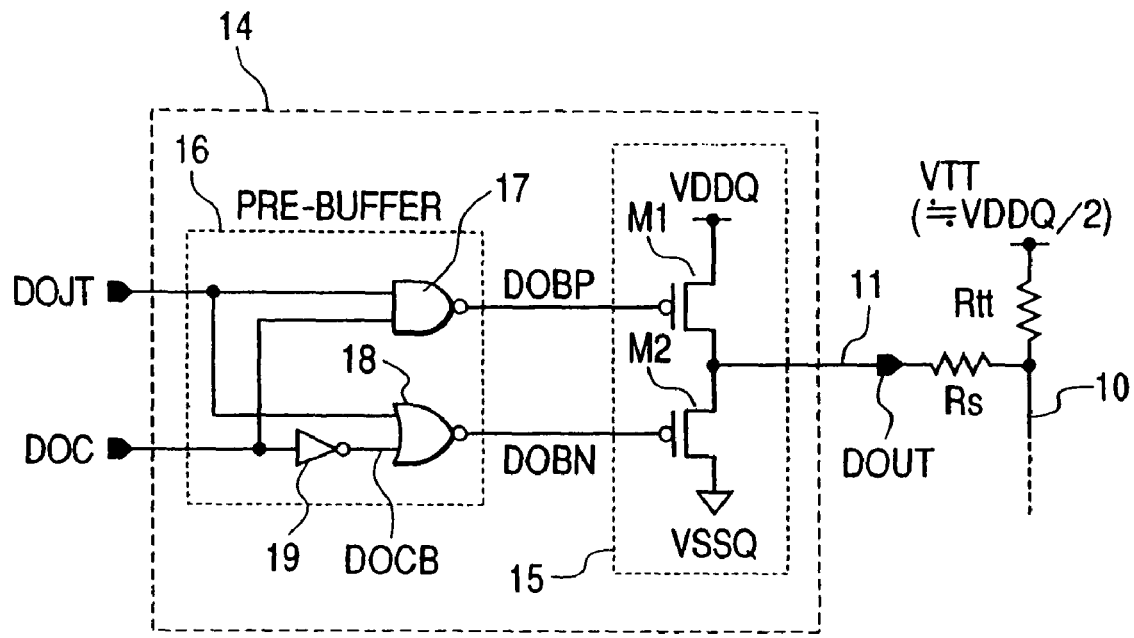
FIG. 6 is a schematic logic circuit diagram showing one example of an output circuit.

FIG. 6 shows an exemplary output circuit of a memory module 4. Although it is not illustrated, the output circuit of the memory controller 2 is configured in the same way. An output circuit 14 shown in the figure is a tri-state output circuit and has an output stage circuit 15 constituting the final output stage and a pre-buffer 16 for controlling the output operation of the output stage circuit 15.

The output stage circuit 15 comprises a CMOS inverter in which a p-channel MOS transistor M1 and an n-channel MOS transistor M2 are serially connected. VDDQ is the power source voltage of the SDRAM, and VSSQ is the ground voltage of the circuit. The termination voltage VTT is set at a voltage level approximately one half of the power source voltage VDDQ.

The pre-buffer 16 includes a NAND gate 17, a NOR gate 18 and an inverter 19, and it receives data DOJT and an output control signal DOC. When the output control signal DOC is at H-level, the data DOJT is outputted from an output pin of the output stage circuit 15. When the output control signal DOC is at L-level, the output signal DOBP of the NAND gate 17 turns into H-level, and the output signal DOBN of the NOR gate 18 turns into L-level, turning both the MOS transistors M1 and M2 into an OFF state, and output pin DOUT into a high output impedance state (Hi-Z).

Figure 7:
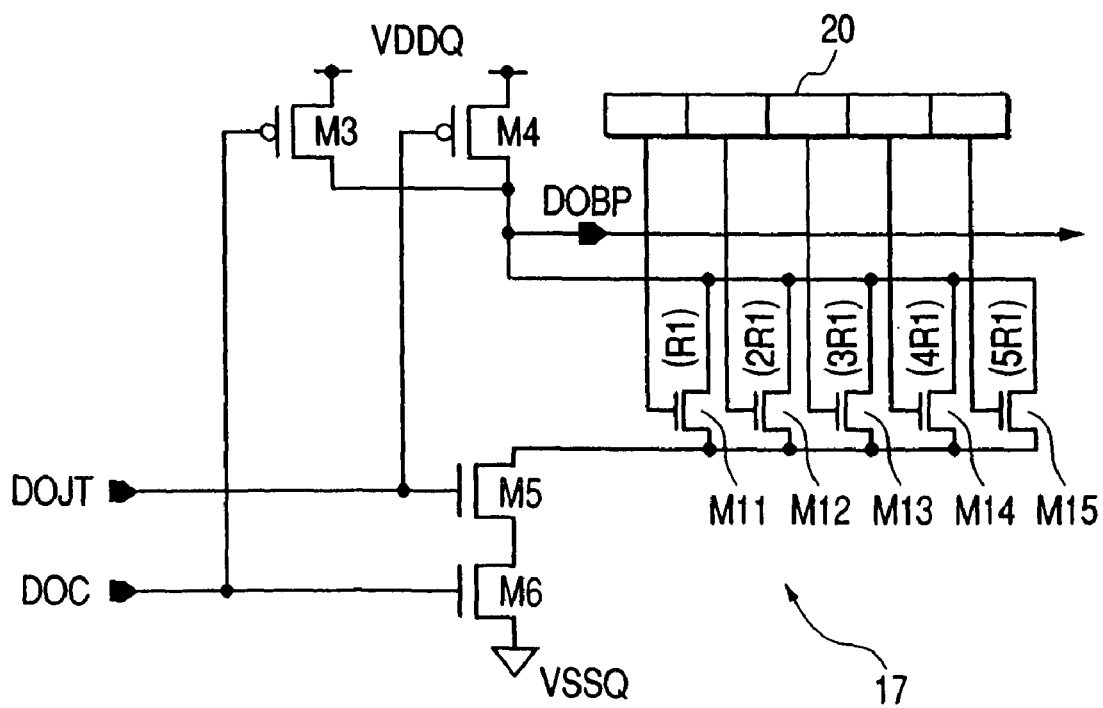
FIG. 7 is a schematic diagram showing one example of a NAND gate.

FIG. 7 shows an example of the NAND gate 17. This circuit is based on a 2-input CMOS NAND gate structure constituted by p-channel MOS transistors M3 and M4, and n-channel MOS transistors M5 and M6, and has n-channel MOS transistors M11-M15 respectively having different gate widths in a parallel arrangement between the common drain of the MOS transistors M3 and M4 and the drain of the MOS transistor M5, forming dumping resistances R1-5R1. The values of the dumping resistances R1-5R1 are sequentially, 1, 2, 3, 4 and 5 times of that of R1. The combined resistance of the dumping resistances R1-5R1, or the switching state of the MOS transistors M11-M15 is determined by the set data of the register 20 which serves as a slew rate setting register. The MOS transistors M11-M15 control the current flowing through the transistors M5 and M6, and controls the fall time of the output DOBP when MN5 and MN6 are turned on.

Figure 8:
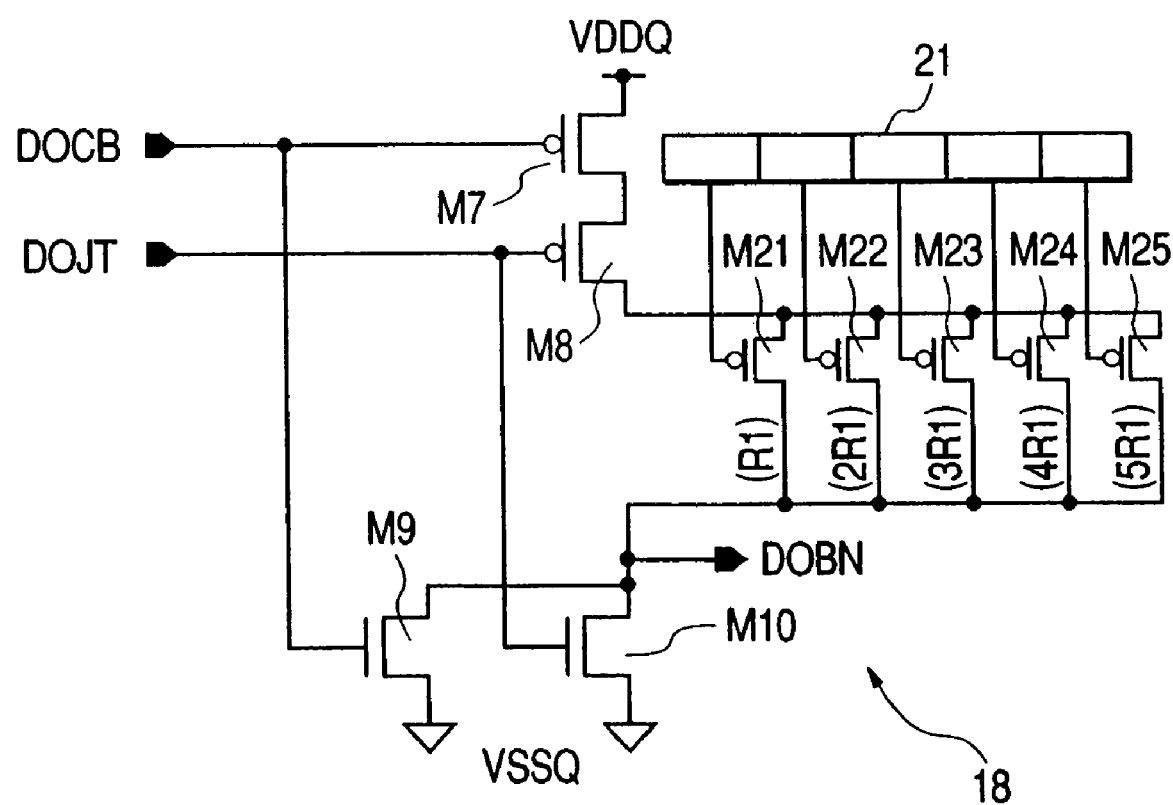
FIG. 8 is a schematic diagram showing one example of a NOR gate.

FIG. 8 shows an example of the NOR gate 18. This circuit is based on a 2-input CMOS NOR gate structure constituted by p-channel MOS transistors M7 and M8 and n-channel MOS transistors M9 and M10, and has n-channel MOS transistors M21-M25 respectively having different gate widths in a parallel arrangement between the common drain of the MOS transistor M8 and the common drain of the MOS transistors M9 and M10, forming dumping resistances R1-5R1. The combined resistance of these dumping resistances R1-5R1, or the switching state of the MOS transistors M21-M25, is determined by set data of the register 21 which serves as a slew rate setting register. The MOS transistors M21-M25 control the current flowing through the transistors M7 and M8, and control the fall time of the output DOBN when MN7 and MN8 are turned on.

When inverting the output of the output pin DOUT in either of the circuit configurations shown in FIGS. 7 and 8, the transient response time of the CMOS inverter constituting the output stage circuit 15 becomes longer with slower fall time of the output DOBP of the NAND gate 17, or slower rise time of the output DOBN of the NOR gate 18, so that the voltage change per unit time, or the slew rate (signal transition time), of the output pin DOUT is alleviated.

Figure 9A:
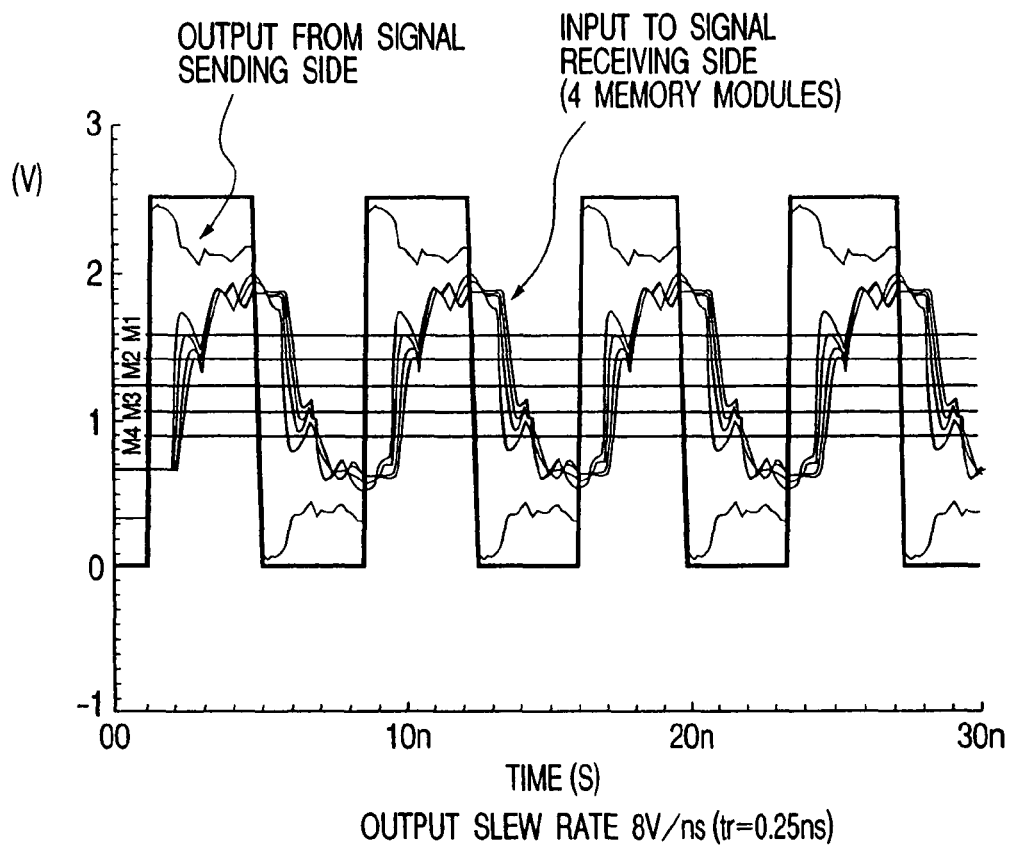
FIGS. 9A and 9B are waveform diagrams showing the difference between the transmission signal waveforms at different slew rates obtained by simulations.
Figure 9B:
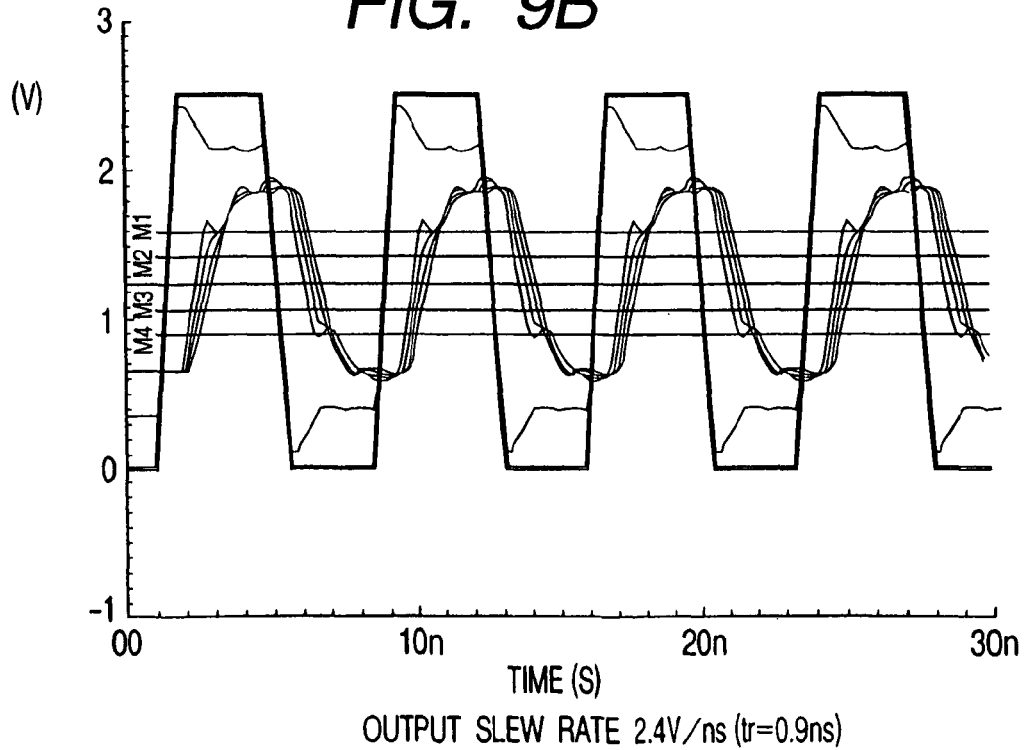

FIGS. 9A and 9B show examples for illustrating the difference obtained by simulations, in the transmission signal waveforms at different slew rates. FIG. 9A shows an example where the slew rate is 8V/ns (rise time: 0.25 ns), and the transmission waveform exhibits relatively significant ringing. In this case, where an input circuit is characterized to comprehend any voltages V1 or greater as being in the high level, and voltages V2 or lower as being in the low level, then it is possible for that input circuit during its operation to determine a high-level pulse as a low-level pulse. FIG. 9B shows an example where the slew rate is reduced to 2.4V/ns (rise time: 0.9 ns), and it is apparent that the ringing in the transmission waveform has been alleviated.

Following explains the arrangements for alleviating the ringing by controlling the slew rate according to the conditions of the implementation of the transmission line 10 and the stub resistances Rsc etc.

<Slew Rate Optimization by Delay Time Measurement>

Now, an arrangement in which the slew rate is optimized by measuring delay time will be explained with reference to an exemplary electronic device. Such circuits for performing the optimization control, according to the example shown in FIG. 3, are included in the SDRAM 4 and memory controller 2.

FIG. 1 shows a configuration in which the memory controller 2 by itself optimizes the slew rate of its output circuit. This embodiment is based on the observation that a slew rate greater than the signal transmission delay time required for making a roundtrip between a signal sending point and a characteristic impedance mismatching point (reflection point) on a transmission line, generally alleviates the reflection.

In the memory controller 2 in FIG. 1, in order to obtain a slew rate suitable for alleviating the reflection at a wiring branch (stub) STB of a memory module 4 and at a receiving pin (input node) of an SDRAM 6 in the memory module 4, a dummy wiring 25 is provided for measuring x2 (roundtrip) of the sum of the signal delay time TPD1 between the output circuit (signal sending point) of the memory controller 2 and the stub STB of the memory module 4, and the signal delay time TPD2 between the stub STB of the memory module 4 and the reflection point at the receiving pin of the SDRAM 6 mounted on the memory module 4. That is, on the motherboard 1, the dummy wiring 25a is formed for replicating or simulating a roundtrip of the data wiring between the memory controller 2 and one memory module 4, and on the module substrate 5 of that one memory module 4, the dummy wiring 25b is formed for replicating the a roundtrip of the data wiring between the stub STB and the data input pin of that one SDRAM 6. The dummy wirings 25a and 25b are connected by a connector 3, forming the dummy wiring 25 which makes a roundtrip originating from, and returning to the memory controller 2. The dummy wiring 25 in the memory controller 2 is provided based on the consideration for obtaining a slew rate to alleviate the reflections at the stub STB of the memory module 4 and at the receiving pin (input node) of the SDRAM 6 in the memory module 4. When a consideration is given mainly to alleviate the reflection at the characteristic impedance mismatching point, or the connector 3, which is a significant reflection point at the nearest end, a signal on the dummy wiring 25a may be looped back at the connector 3 to be fed back.

The dummy wiring 25 is a wiring simulating an actual wiring, of course, in terms of impedance etc. For example, the dummy wiring 25 has the impedance substantially equal to that of the actual wiring 26 which transmits signals from the memory controller 2 to the SDRAM 4. The actual wirings 26 shown in FIG. 1 are assumed to be equal-length wirings.

The memory controller 2 has a one-shot pulse generating circuit 28, a detection circuit 29 for detecting the signal delay time on the dummy wiring 25, a slew rate setting register 30, and a data output circuit 31 having variable slew rate. The one-shot pulse generating circuit 28 generates signals to be supplied to the dummy wiring 25. The detection circuit 29 for detecting the signal delay time on the dummy wiring 25 detects the difference between the rise time of a signal outputted from the one-shot pulse generating circuit 28, and the rise time of the signal returned via the dummy wiring 25, and sets the slew rate setting register 30 with a control code (digital code) corresponding to the obtained time difference.

The output circuit 31 has a circuit configuration of FIG. 6 for each of the output signal lines. The output circuit 31 is so designed that a selected mode of the dumping resistances R1-5R1 in its NAND gate 17 and NOR gate 18 may be matched with the detection result by the circuit 29 which detects the signal delay time. For example, a digital code outputted by the detection circuit 29 is designed to allow generating the combined resistance of the dumping MOS transistors M11-M15 and M21-M25 so as to set the delay time detected by the detection circuit 29 as the signal transition time of the output circuit 30, in other words, so as to allow the slew rate of the output circuit 31 to replicate the detected delay time. In consideration to the characteristic variation (Ids) of the devices within a chip due to the temperature, power-source voltage and process variability, the data output circuit 31 of the variable slew rate and the detection circuit for detecting the signal delay time are constituted by MOS transistors having the same characteristic variation. In this manner, the variation in the slew rate (rise time) of the variable slew rate data output circuit 31 and the variation in the signal delay time at the delay stage within the signal delay time detection circuit 29 would have similar tendencies, so that this matching between the slew rate of the variable slew rate data output circuit 31 and the control code of the signal delay time detection circuit 29 would not collapse easily.

Accordingly, the variable slew rate output circuit 31 is capable of outputting a signal at a slew rate using the signal delay time on the dummy wiring 25 as its signal transition time.

Figure 2:
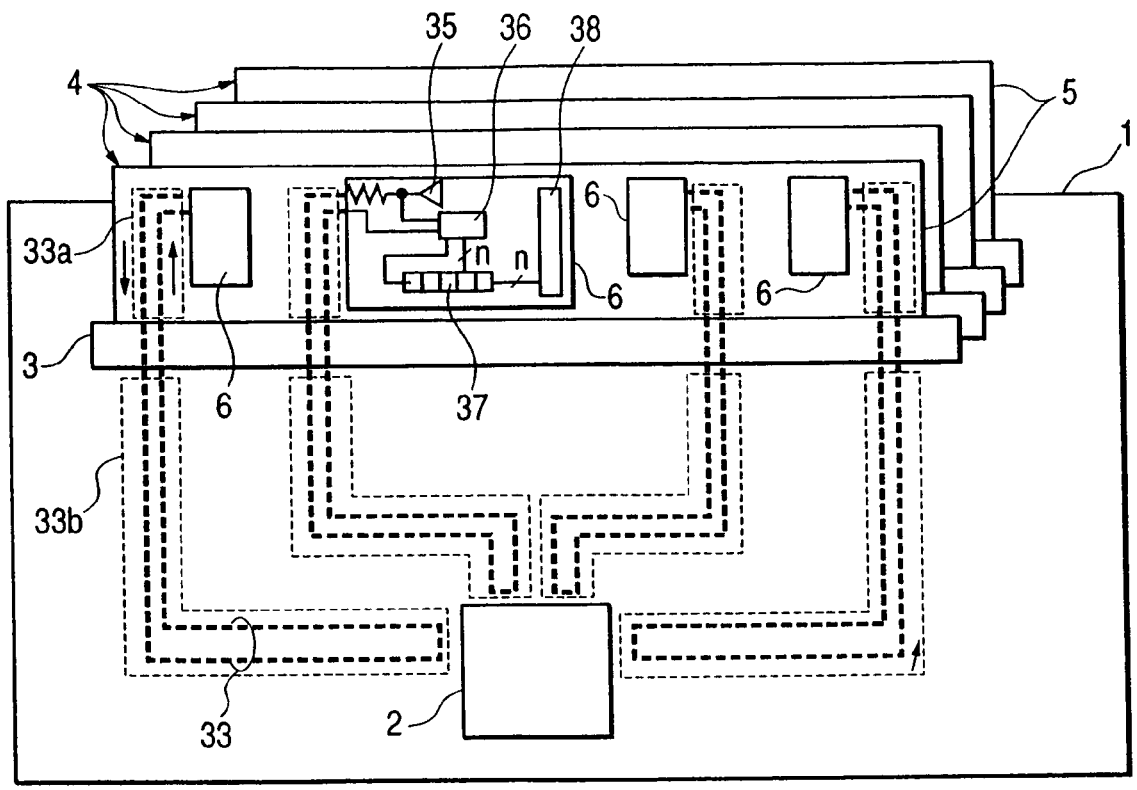
FIG. 2 is a block diagram showing an exemplary configuration of SDRAMs to optimize the slew rate of their output circuits.

FIG. 2 shows a configuration of an SDRAM 6 for optimizing by itself the slew rate of its output circuit. In this embodiment in an SDRAM 6, in order to obtain a slew rate to alleviate the reflections at a stub STB of the memory module 4 on which that SDRAM 6 is mounted and at the signal receiving pin of the memory controller 2, a dummy wiring 33 is provided for measuring x2 (roundtrip) of the sum of the signal delay time TPD2 between the signal sending point and the stub STB of the memory module 4 and the signal delay time TPD1 between the stub STB of the memory module 4 and the signal receiving pin of the memory controller 2. That is, on the module substrate 5 of that memory module 4, a dummy wiring 33a is formed to replicate or simulate the data wiring (roundtrip) between the SDRAM 6 and the stub STB of the connector 3. Similarly, on the motherboard 1, a dummy wiring 33b is formed to replicate or simulate the data wiring (roundtrip) between the stub STB of the connector 3 and the data input pin of the memory controller 2. The dummy wirings 33a and 33b are connected by the connector 3, forming the dummy wiring 33 which makes a roundtrip originating from, and returning to the SDRAM 6. In a similar manner as the previous example, when a consideration is given mainly to alleviate the reflection at the characteristic impedance mismatching point, or the connector 3, which is a significant reflection point at the nearest end, a signal on the dummy wiring 33a may be looped back at the connector 3 to be fed back.

The dummy wiring 33 is a wiring simulating an actual wiring, of course, in terms of impedance etc. For example, the dummy wiring 33 has the impedance substantially equal to that of the actual wiring (not shown) which transmits signals from the SDRAM 6 to the memory controller 2.

Like the memory controller 2 previously described, the SDRAM 6 also has a one-shot pulse generating circuit 35, a detection circuit 36 for detecting the signal delay time on the dummy wiring, a slew rate setting register 37, and a variable slew rate data output circuit 38. The data output circuit 38 has the output circuit of FIG. 6 for each of the signal line. The slew rate setting register 37 corresponds to the registers 20 and 21 in FIGS. 7 and 8. In FIG. 2, the dummy wiring 33 is provided for each SDRAM 6. If the actual lines from the respective SDRAMs 6 to the memory controller 2 are equal in length, and there are signal wirings to transmit the register value set to one SDRAM 6 to the rest of the SDRAMs 6, then a single dummy wiring 33 may be provided to one SDRAM 6, so that one-shot pulse generating circuits 35 and the detection circuits 36 may be unnecessitated for the rest of the SDRAMs.

According to the configuration of FIG. 2, as in the previously described memory controller 2, the variable slew rate output circuit in the SDRAM 6 is capable of outputting a signal at a slew rate using the signal delay time on the dummy wiring as its signal transition time.

Figure 10:
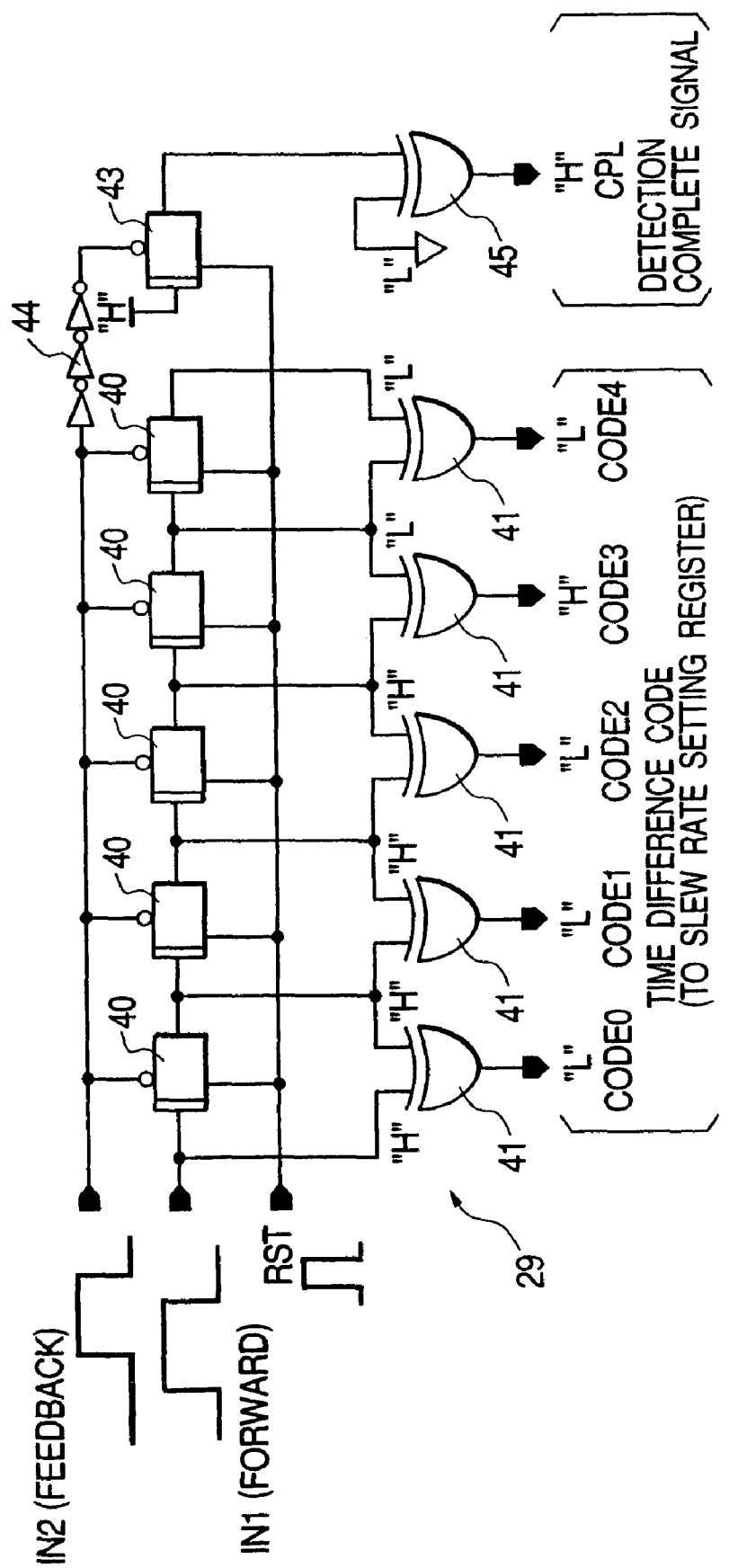
FIG. 10 is a schematic logic circuit diagram showing one example of the circuit for detecting signal delay time in the dummy wiring.
Figure 11:
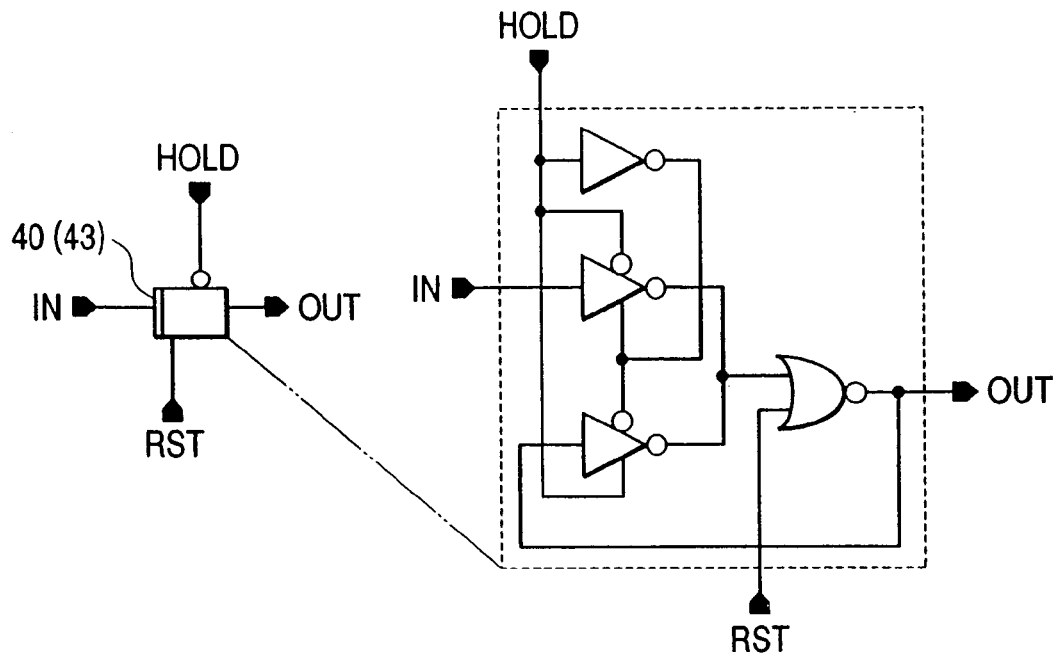
FIG. 11 is a schematic logic circuit diagram showing an exemplary logic configuration of a latch circuit included in the detection circuit.

FIG. 10 indicates one example of the circuit 29 for detecting the signal delay time on the dummy wiring. FIG. 11 shows an exemplary logic configuration of the latch circuits 40, 43 included in the detection circuit 29. The detection circuit 36 in FIG. 2 may be configured in the same way as shown in FIG. 10.

The detection circuit 29 mainly has a delay line to which a plurality of stages of the latch circuits 40 are serially connected, and EXCLUSIVE OR gates 41 for determining matching/mismatching of the input/output values of the respective latch circuits 40 on the delay line are provided, and the parallel outputs of the EXCLUSIVE OR gates 41 are designated as the control codes CODE0-CODE4. A latch circuit 40 receives a signal in1 from the generation terminal of the one-shot pulse generating circuit 28 as its data input, and is controlled from a through state to a latch state when a signal in2 fed back from the dummy wiring 25 turns into the high level. The latch circuit 43, by being controlled from a latch state into a through state by an inverted signal of the signal in2 supplied via the inverting delay circuit 44, generates output determination timing for the EXCLUSIVE OR gates 41. The EXCLUSIVE OR gates 45 output detection complete signals CPL.

Referring to FIG. 10, all the latch circuits 40, 43 are reset by a reset signal RST. At this point, since the signal in2 is at the low level, the latch circuits 41 are set in a through state and the latch circuit 43 is set in a latch state, respectively outputting the low level. Next, when the one-shot pulse signal in1 is inputted, the signal in1 is sequentially carried through the vertically connected latch circuits 40. Thereafter, when the signal in2, which is fed back with a delay by a certain time period td from the change of the signal in1, is inputted, the latch circuits 40 are turned into a latch state in synchronization with the change in the signal in2 to the high level. By this, the transmission of the signal in1 is suspended after it has advanced through the vertically connected latch circuits 40 for the time period td. That is, those latch circuits 40 the signal in1 has gone through would output the high level and the latch circuits 40 on the rest of the stages would maintain the low level outputs. Therefore, those EXCLUSIVE OR gates 41 corresponding to the locations of the latch circuits 40 to which the signal in1 could have reached within the time period td, would output the high level, and the rest of the EXCLUSIVE OR gates 41 would output the low level. In this manner, which of the EXCLUSIVE OR gates 41 output the high level may be determined from the time difference codes (control code) CODE0-CODE4 that the plurality of the EXCLUSIVE OR gates 41 output, so that the time difference between the signals in1 and in2, or a delay time of the signal in2 relative to the signal in1, may be apparent. Once the output of the control code CODE0-CODE4 by the EXCLUSIVE OR gates 41 are determined, the latch circuit 43 is turned into a through state, so that the detection complete signal CPL is turned into a high level. The slew rate setting register 30 is triggered by this high level output of the detection complete signal CPH, and starts receiving the time difference code (control code) CODE0-CODE4.

Figure 12:
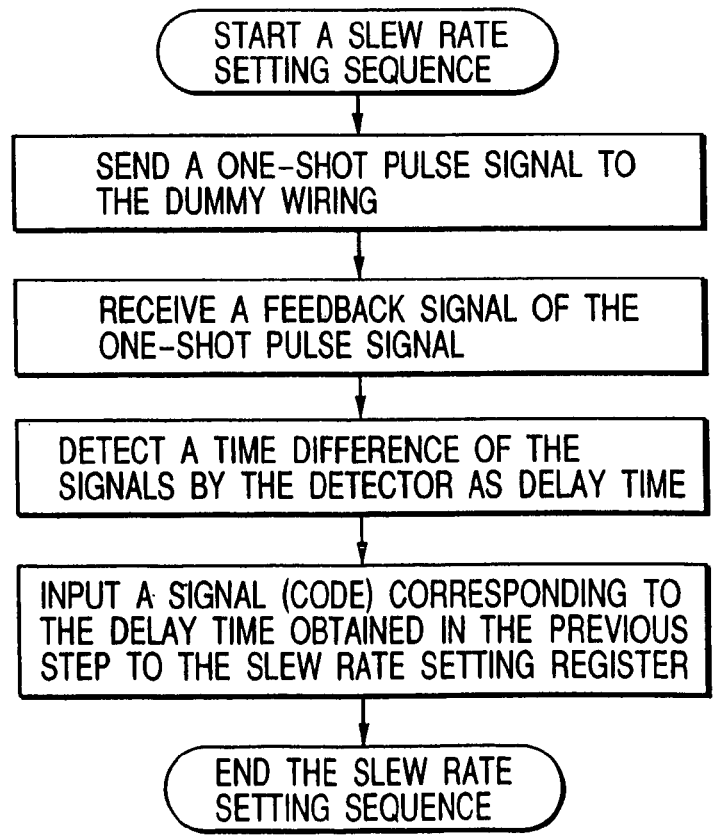
FIG. 12 is a flow chart illustrating the control date setting steps for the slew rate setting register.
Figure 13:
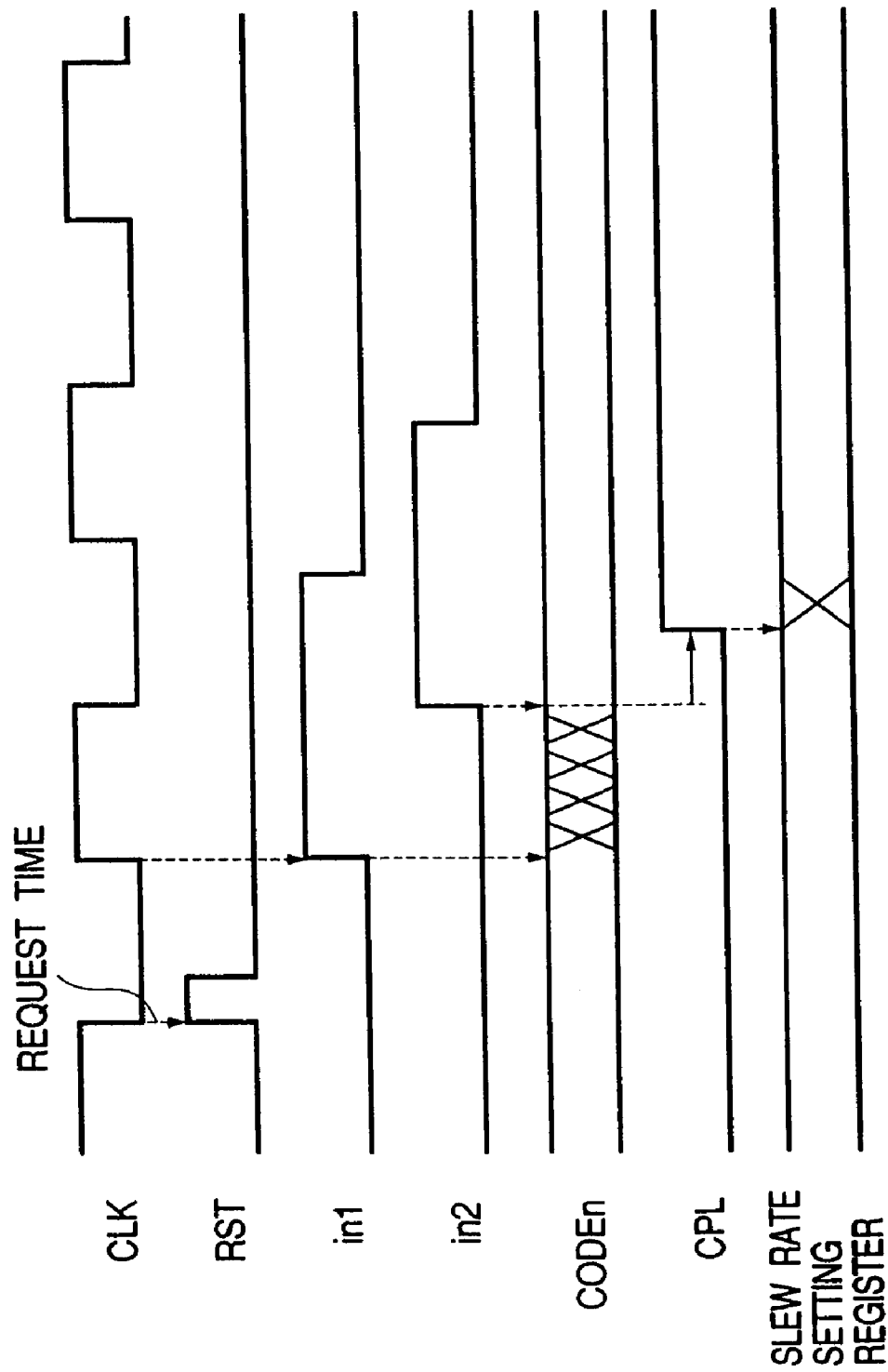
FIG. 13 is a timing diagram showing an operating timing of the processes of the flow chart.

FIG. 12 shows a flow chart for the control data setting operation for the slew rate setting register, and FIG. 13 shows the operating timing of the processes of the flow chart.

The steps in the flow chart of FIG. 12 are common for the memory controller and SDRAM, and they may perform the steps either independently or in parallel.

The slew rate setting sequence starts upon the reception of a power-on reset request command or a setting operation request command for the slew rate setting register, and at first, the signal delay time detection circuit is reset. Next, the one-shot pulse circuit sends out a one-shot pulse to the dummy wiring. At this point, this signal is also inputted to the signal delay time detection circuit as the signal in1. The one-shot pulse is returned from the dummy wiring and inputted to the signal delay time detection circuit as the signal in2. The signal delay time detection circuit detects the delay time (TPD1+TPD2).times.2, and a control code CODE0-CODE4 (CODEn) corresponding to the detected delay time is outputted. Thereafter, the control code CODEn is received by the slew rate setting register in synchronization with the complete signal CPL.

As explained in the above, a dummy wiring, which is suitably configured for a reflection point corresponding to the voltage reflection to be alleviated, is provided on the motherboard or on the module substrate, and the slew rate of the data output circuit is set on the basis of the result of measurement of the signal transmission delay time on that dummy wiring, so that the slew rate suitable for alleviating the voltage reflection at any desired reflection point (characteristic impedance mismatching point) may be set according to the conditions of the implementation on the motherboard or module substrate, thus, such a configuration may contribute to the realization of highly reliable data transmission.

Figure 14:
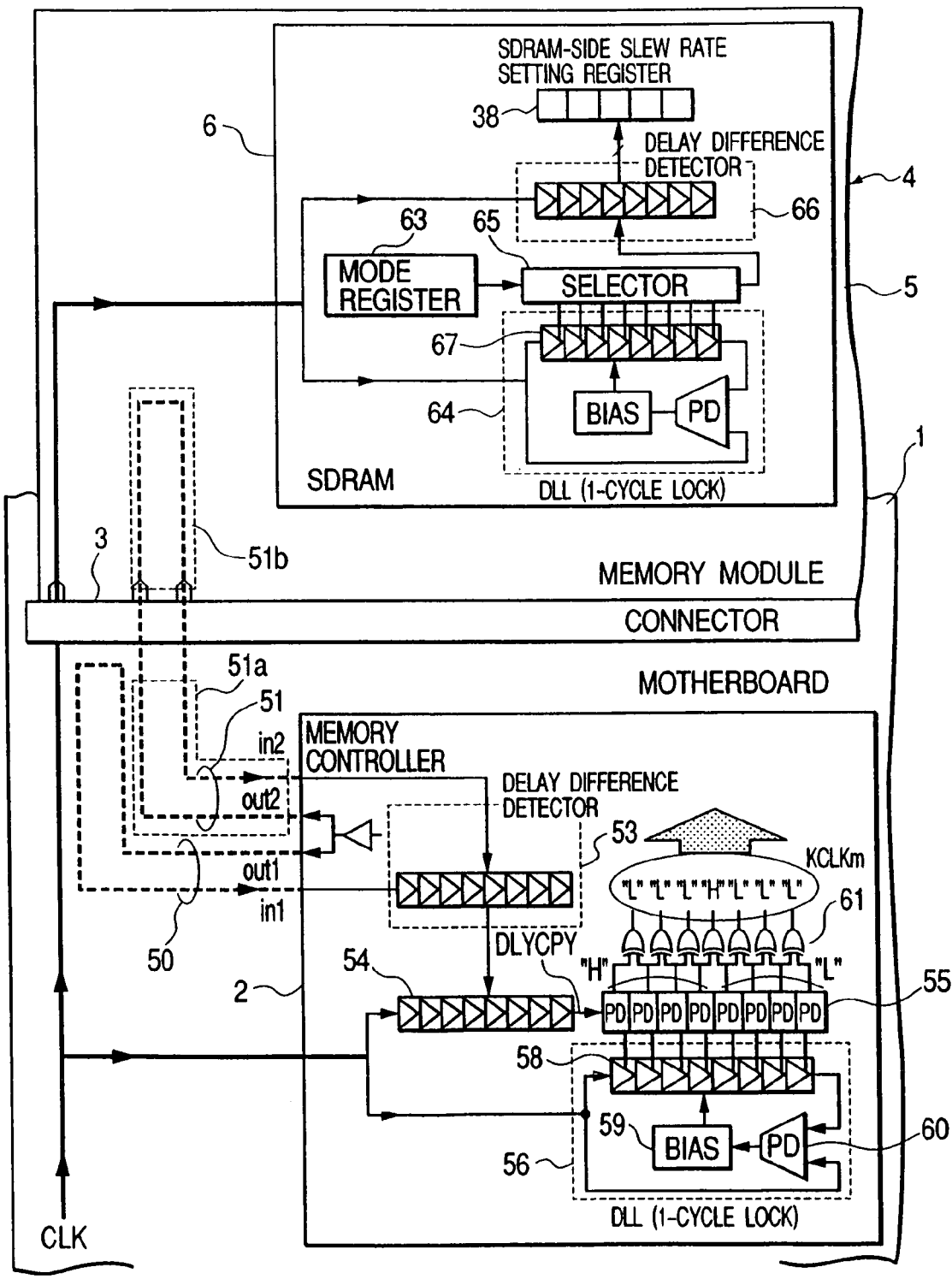
FIG. 14 is a block diagram showing an exemplary electronic device which allows the memory controller to also perform the delay time measurement operation for the slew rate setting for the SDRAM.

FIG. 14 shows an exemplary electronic device in which the memory controller is also capable of performing the delay time measurement operation for slew rate setting for the SDRAM.

In the example of FIG. 14, dummy wirings 50 and 51 are used. The dummy wiring 50 is a wiring equivalent to the dummy wiring 25a extending up to the connector 3 as a part of the dummy wiring 25 of FIG. 1, which has been made to return from the connector 3. The other dummy wiring 51 is a combination of a portion 51a corresponding to the dummy wiring 25a extending up to the connector 3 as a part of the dummy wiring 25 of FIG. 1 and a portion 51b corresponding to the dummy wiring 33a extending up to the connector 3 as a part of the dummy wiring 33 in FIG. 2, and this employs a connection topology which originates from, and feeds back to the memory controller 2 via the connector 3. The dummy wiring 50 and the portion 51a of the dummy wiring 51 have substantially equal transmission delay time.

The one-shot pulse output circuit 52 outputs a test signal to both the dummy wirings 50 and 51. The delay difference detection circuit 53 is configured in the same manner as the configuration of FIG. 10, and the signal in1 is a feedback signal of the dummy wiring 50 and the signal in2 is a feedback signal of the dummy wiring 51. By passing through the delay circuit 54, the phase comparator circuit column 55 and DLL (Delay Locked Loop) 56 a detection output such as the code CODE0-CODE4 of the delay difference detection circuit 53, a data KCLKm is generated, which indicates the signal delay time measured by the delay difference detection circuit 53 as being how many times of 1/integer (n) of the cycle time of the system clock signal CLK. The generated data KCLKm is sent to the SDRAM 6, and the SDRAM 6 is configured to set the slew rate based on the data KCLKm.

Next, the above is explained in further detail. In order to generate 1/integer (n) of the cycle time of the system clock signal CLK, the DLL 56 having "n" analog delay stages. In the DLL 56, the analog delay means is constituted by a delay circuit column 58, a bias circuit 59 and a phase comparator circuit 60. The unit delay time of the delay circuit column 58 is controlled by a bias voltage of the bias circuit 59, and the bias voltage controls the unit delay time of the delay circuit column 58 so as to match the output of the delay circuit column 58 and the phase of the system clock signal CLK.

The data (equivalent to the slew rate setting data CODEn of the memory controller in FIG. 10) obtained by the delay difference detection circuit 53 is inputted to a delay circuit column (delay line) 54 that is same as the one used for the delay difference detection circuit 53, and a clock signal DLY-CPY is generated, which has the timing delayed relative to the system clock signal CLK by the signal delay time measured by the delay difference detection circuit 53 of the memory controller 2. The signal DLYCPY is phase-compared with the output signals from respective delay output stages of the delay circuit column 58 by the phase comparator circuit column 55, then the EXCLUSIVE OR circuit column 61 outputs a data KCLKm indicating which one of the delay stages has supplied the delay stage output having the closest phase to that of the signal DLYCPY. The data KCLKm is fed to the mode register 63 of the SDRAM 6 using, although it is not limited, a signal for the mode register of the SDRAM 6 (Mode Register Set command).

To convert the data indicating the signal delay time measured by the delay difference detection circuit 53 of the memory controller 2 as being how many times of the base cycle time of the system clock signal CLK, into the slew rate setting data in the SDRAM 6, a DLL 64 which generates 1/integer (n) of the cycle time, a selector 65 and a delay difference detection circuit 66 are used in the similar manner as the above. This time, contrary to the above, one among the outputs of respective delay stages of the delay circuit column 67 of the DLL 64 is first selected by the selector 65 based on the data KCLKm set to the mode register 63, and the selected delay signal is inputted to the delay difference detection circuit 66 to convert the signal delay time measured by the delay difference detection circuit 53 of the memory controller 2 into the slew rate setting data in the SDRAM 6, and this data is then set to the register 38.

Although it is not shown, the slew rate setting data of the memory controller 2 is automatically obtained by the memory controller 2 by the use of the dummy wiring 50 and the similar configuration and approach shown in FIG. 1. The delay difference detection circuit 66 also has a circuit configuration similar to that shown in FIG. 10.

Figure 15:
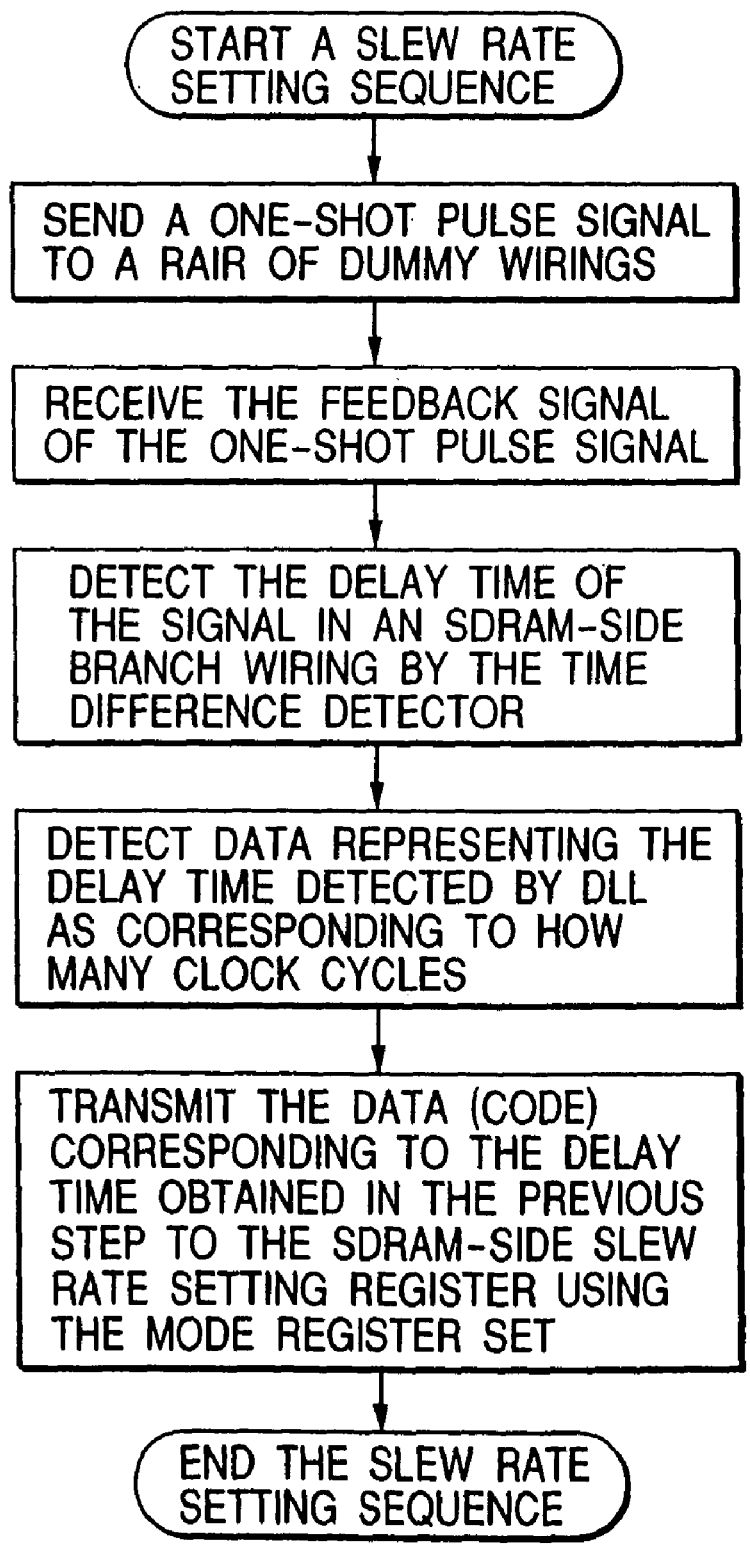
FIG. 15 is a flow chart explaining an exemplary control data setting steps performed by the memory controller for the slew rate setting register of the SDRAM.
Figure 16:
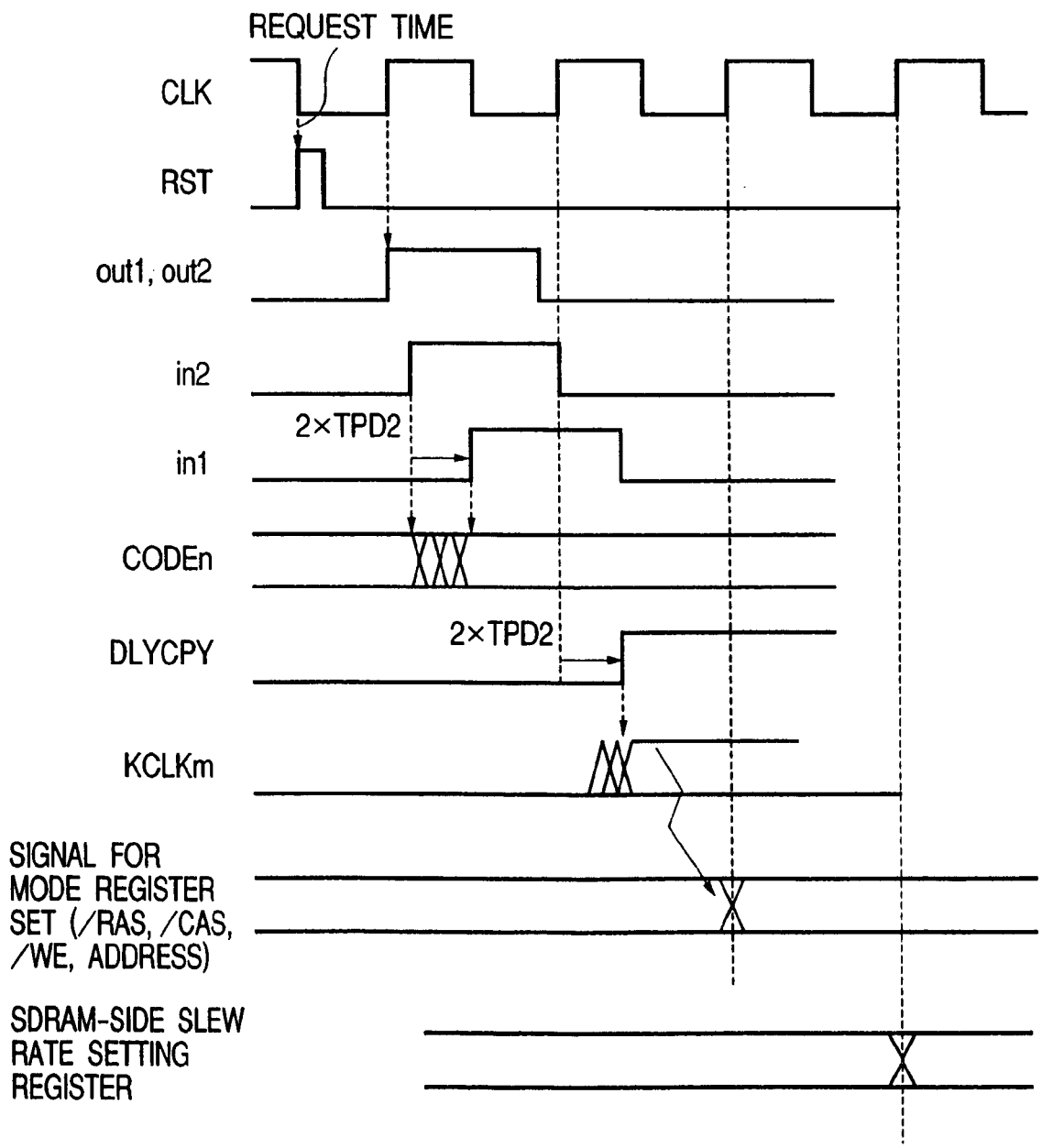
FIG. 16 is a timing chart of an exemplary processing operation performed in accordance with the flow chart of FIG. 15.

FIG. 15 shows a flow chart for the control data setting operation for the slew rate setting register of the SDRAM by the memory controller, and FIG. 16 shows the operation timing of the processes according to the flow chart.

Use of the configuration shown in FIG. 14 would require almost no dummy wiring on the SDRAM side, so that the wiring areas on the memory module or the board may be minimized.

<Outline of SDRAM>

Figure 17:
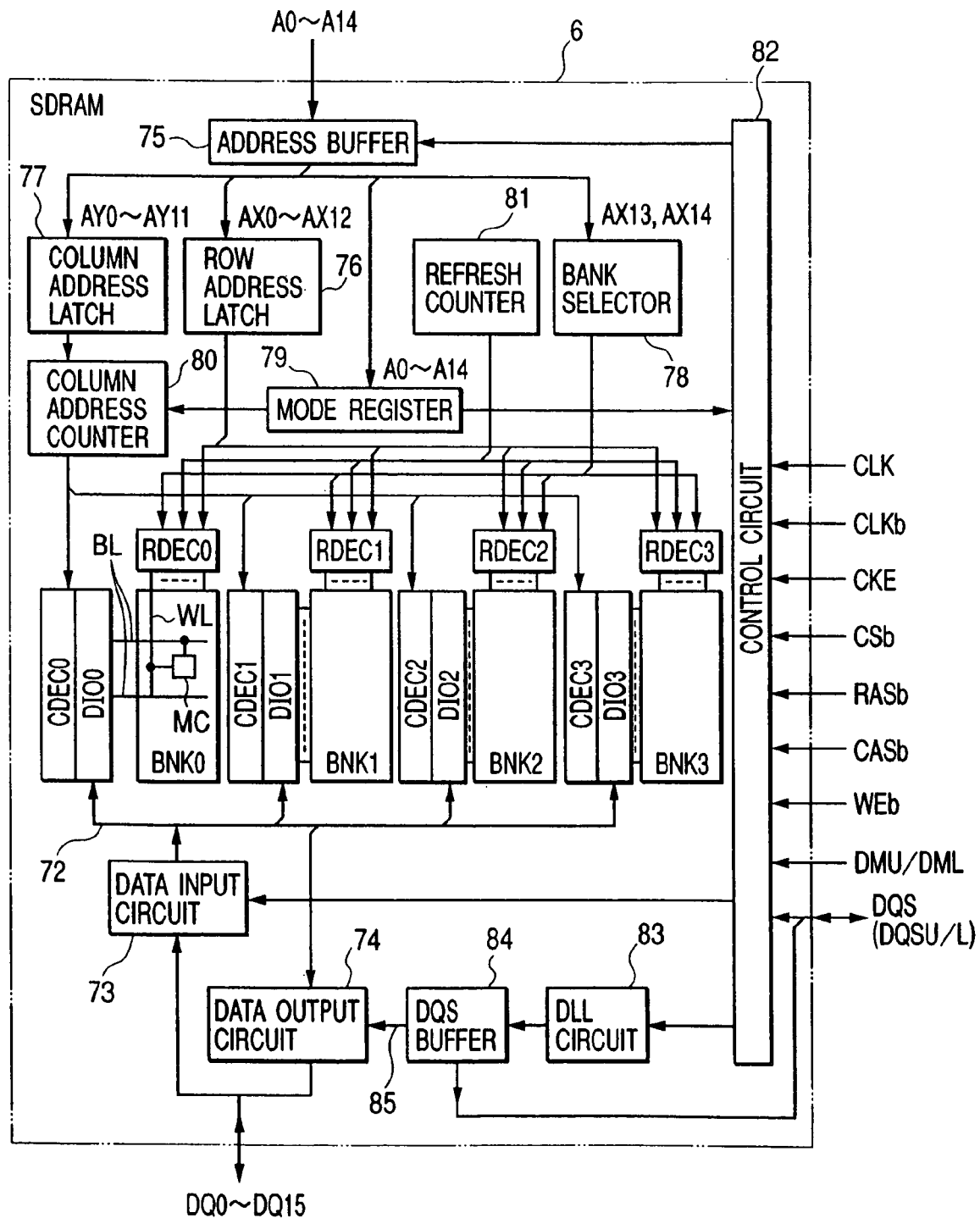
FIG. 17 is a block diagram of the SDRAM.

Now, the outline of the SDRAM 6 will be explained. FIG. 17 shows a block diagram of the SDRAM 6. The circuit configuration for the slew rate automatic setting is omitted in FIG. 17.

SDRAM 6 includes, but not limited to, four memory banks BNK0-BNK3. Each of the memory banks BNK0-BNK3 includes dynamic memory cells MC arranged in a matrix. According to the diagram, the selection pins of the memory cells MC arranged in a same column are coupled to a word line WL provided for each of the columns, and the data input/output pins of the memory cells arranged in a same row are coupled to either one of complementary bit lines BL, BL by each row. Although only the portions of the word lines WL and the bit lines BL are representatively shown in the diagram, in an actual implementation, many of them are arranged in a matrix, having folded bit line structures centered at sense amplifiers.

Row decoders RDEC0-RDEC3, data input/output circuits DIO0-DIO3 and column decoders CDEC0-CDEC3 are provided for the respective memory banks BNK0-BNK3.

The word lines WL are selected by the decoding results of row address signals from the row decoders RDEC0-RDEC3 provided for the respective memory banks BNK0-BNK3, and are driven to the selected levels.

Each of the data input/output circuits DIO0-DIO3 has a sense amplifier, a column selection circuit and a write amplifier. The sense amplifier is a circuit which detects and amplifies a minute potential difference which appears on each of the complementary bit lines BL, BL upon the read-out of data from a memory cell MC. The column selection circuit is a switching circuit for selecting the complementary bit lines BL, BL and connecting them to an input/output bus 72 such as a complementary common data line. The column selection circuit is selectively operated according to the decoding result of a column address signal by the corresponding one of the column decoders CDEC0-CDEC3. The write amplifier is a circuit which performs differential amplification of the complementary bit lines BL, BL through the column switching circuit according to the write data.

A data input circuit 73 and a data output circuit 74 are connected to the input/output bus 72. The data input circuit 73, in the writing mode, receives the input of write data which is supplied from the outside, and transmits the data to the input/output bus 72. The data output circuit 74, in the read-out mode, receives the input of read-out data transmitted by the input/output bus 72 from the memory cell MC, and externally outputs the data. The input pin of the data input circuit 73 and the output pin of the data output circuit 74 are coupled, although it is not limited, to 16-bit data input/output pins DQ0-DQ15. For the purpose of illustration, the data being externally inputted or outputted by the SDRAM 6 may sometimes be referred also by the reference numerals DQ0-DQ15.

The SDRAM 6 has 15-bit address input pins A0-A14 although it is not limited. The address input pins A0-A14 are coupled to an address buffer 75. Among the addresses supplied to the address buffer 75 in a multiplexed form, row address signals AX0-AX12 are provided to a row address latch 76, column address signals AY0-AY11 are provided to a column address latch 77, bank selecting signals AX13, AX14 are provided to the bank selector 78, and mode register setting data A0-A14 are provided to the mode register 79.

The four memory banks BNK0-BNK3 are selected by the bank selector 78 according to the logic values of the 2-bit bank selecting signals AX13 and AX14 for operation, therefore, only memory banks selected for operation are capable of performing memory operation. For example, the sense amplifiers, write amplifiers and column decoders are not activated in memory banks that have not been selected for the operation.

The low address signals AX0-AX12 latched by the row address latch 76 are supplied to the row address decoders RDEC0-RDEC3.

The column address signals AY0-AY11 latched by the column address latch 77 are preset by a column address counter 80, and supplied to the column address decoders CDEC0-CDEC3. When a burst access, which is a continuous memory access, is instructed, the column address counter 80 is incremented by the number of the continuation (number of bursts), and the column address signals are internally generated.

A refresh counter 81 is an address counter generating by itself the row addresses to which refresh operations are to be performed over the stored data. When a refresh operation is instructed, a word line WL is selected according to a row address signal outputted from the refresh counter 81, and the refresh is performed over the stored data.

To a control circuit 82, a specified data is supplied from the mode register 79 as well as the external signals including, but not limited to, clock signals CLK and CLKb, clock enable signal CKE, chip selecting signal CSb, column address strobe signal CASb, row address strobe signal RASb, write enable signal WEb, data mask signals DMU, DML and data strobe signal DQS (the signals referred by the reference numerals with the suffix "b" represent low enable signals or level-inverted signals). The operation of the SDRAM 6 is determined by a command defined by the combination of the states of those input signals, and the control circuit 82 includes a controlling logic for forming an internal timing signal corresponding to the operation instructed by that command.

The clock signals CLK and CLKb are treated as a master clock of the SDRAM, and other external input signals may be made significant when they are synchronized with the rising edge of the clock signal CLK.

The low level of the chip select signal CSb instructs the start of the command input cycle. When the chip select signal is at the high level (in chip nonselect state), any other inputs have no significance. However, the selected state of the memory bank, which will later be described in detail, and internal operations such as the burst operation etc. would not be affected by the transition into the chip nonselect state.

Each of the signals RASb, CASb and WEb is differentiated in its function from a comparable signal in an ordinary DRAM, and it becomes significant when defining the command cycle, which will later be described.

The clock enable signal CKE is a control signal in the power-down mode and self-refresh mode, and when in the power-down mode (which is also the data-retention mode in an SDRAM), the clock enable signal CKE is turned into the low level.

The data mask signals DMU and DML are mask data in bytes for the inputted write data, and the data mask signal DMU at the high level instructs to inhibit the writing by the higher order bytes of the write data, and the data mask signal DML at the high level instructs to inhibit the writing by the lower order bytes of the write data.

The data strobe signal DQS is externally supplied as a write strobe signal during the writing operation. That is, when the writing operation in synchronization with the clock signal CLK is instructed, it specifies the supply of data synchronous to the data strobe signal DQS from a clock signal cycle after the clock signal cycle in which the instruction was made. During a read-out operation, the data strobe signal DQS is externally outputted as a read strobe signal. That is, during the read-out operation of the data, the data strobe signal is changed in synchronization with the external output of the read-out data. To this end, a DLL circuit 83 and a DQS output buffer 84 are provided. The DLL circuit 83 regulates the phase of a clock signal 85 (a control signal in-phase with the data strobe signal DQS in the read-out operation) for controlling the data output operation in order to synchronize the output timing of the data by the data output circuit 74 with the clock signal CLK which the SDRAM 6 receives. The DLL circuit 83 reproduces the internal clock signal 85 which is capable of compensating the signal transmission delay time characteristic of the internal circuits by means of, but not limited to, a replica circuit technology and phase-lock technology, thus, the data output circuit 74 operated based on the internal clock signal 85, may output data at the timing precisely synchronous to the external clock signal CLK. The DQS buffer 84 externally outputs the data strobe signal DQS in-phase with the internal clock signal 85.

The row address signals AX0-AX12 are defined by the levels of the address input pins A0-A12 during the row address strobe bank active command (active command) cycle in synchronization with the rising edge of the clock signal CLK. During the active command cycle, the signals AX13 and AX14 inputted from the address input pins A13 and A14 are considered as bank select signals. A memory bank selected by the bank select signal is subject to the data read-out operation by a read command, the data write operation by a write command, and the precharge operation by a precharge command.

The column address signals AY0-AY11 are defined by the levels at the pins A0-A11 during column address read command (read command) cycle and column address write command (write command) cycle in synchronization with the rising edge of the clock signal CLK, which will be explained later in detail. The column addresses specified in this way serve as the start addresses of the burst access.

Commands of the SDRAM are designated by the combinations of levels of signals such as CSb, RASb, CASb and WEb etc. For example. Mode Register Set Command is a command for setting the mode register 9. This command is designated by CSb, RASb, CASb and WEb=Low Level, and the data to be set (register setting data) is fed through A0-A14. Moreover, the row address strobe bank active command is a command which enables the selection of memory banks by the instructions of the low address strobe and A13 and A14, and is designated by CSb and RASb=Low Level ("0"), and CASb and WEb=High Level ("1"). The addresses fed at this time to A0-A12 are fetched as row address signals and the signals fed to A13 and A14 are fetched as signals for selecting memory banks. These fetching actions are performed in synchronization with the rising edge of the internal clock signal CLK as described above. When the command is designated, for example, a word line in the memory bank designated thereby is selected so that the memory cells connected with the selected word line are electrically connected to the corresponding complementary bit lines. The column address read command is a command necessary to start a burst read operation and at the same time to designate the column address strobe, and the command is designated by CSb and CASb=Low Level and RASb and WEb=High Level. The addresses fed at this time to A0-A11 are fetched as the column address signals. The column address signals so fetched are preset to the column address counter 10 as the burst start addresses. In the burst read operation instructed in this way, the memory banks and their word lines are selected in the preceding row address strobe bank active command cycle, and the memory cells of the selected word lines are sequentially selected (i.e. in units of 32 bits) in the memory banks according to the address signals which are outputted from the column address counter 10 in synchronization with the internal clock signal CLK, and they are externally outputted continuously in units of 16 bits in synchronization with the rising edge and falling edge of the data strobe signal DQS.

In the embodiments shown in FIGS. 1 and 2, the signal output circuit which optimizes the slew rate may be the one which outputs addresses, data and various strobe signals. It is especially desirable to place the focus on the output circuit of the data strobe signals DQS. The data strobe signals DQS indicate validity in the case of write data, and determination of output data in the case of read data. Therefore, the data strobe signals DQS are used as timing signals during the memory or system operations. When performing a fetch operation of read data or a write operation is performed in synchronization with an edge transition of the data strobe signal DQS, the waveform fluctuation due to ringing may disturb the operation timing, and especially under high speed-operation with relatively small timing margin, it is very likely to result in a critical error. In light of the above consideration, it is believed to be more effective to provide the slew rate optimization to signal output circuits of timing signals such as the data strobe signals DQS rather than to those output circuits of addresses or data, when the prevention of error is desired.

<Slew Rate Optimization by Waveform Measurement>

Now, an embodiment for optimizing the slew rate by measuring signal waveforms will be explained according to an exemplary electronic device shown in FIG. 3.

Figure 18:
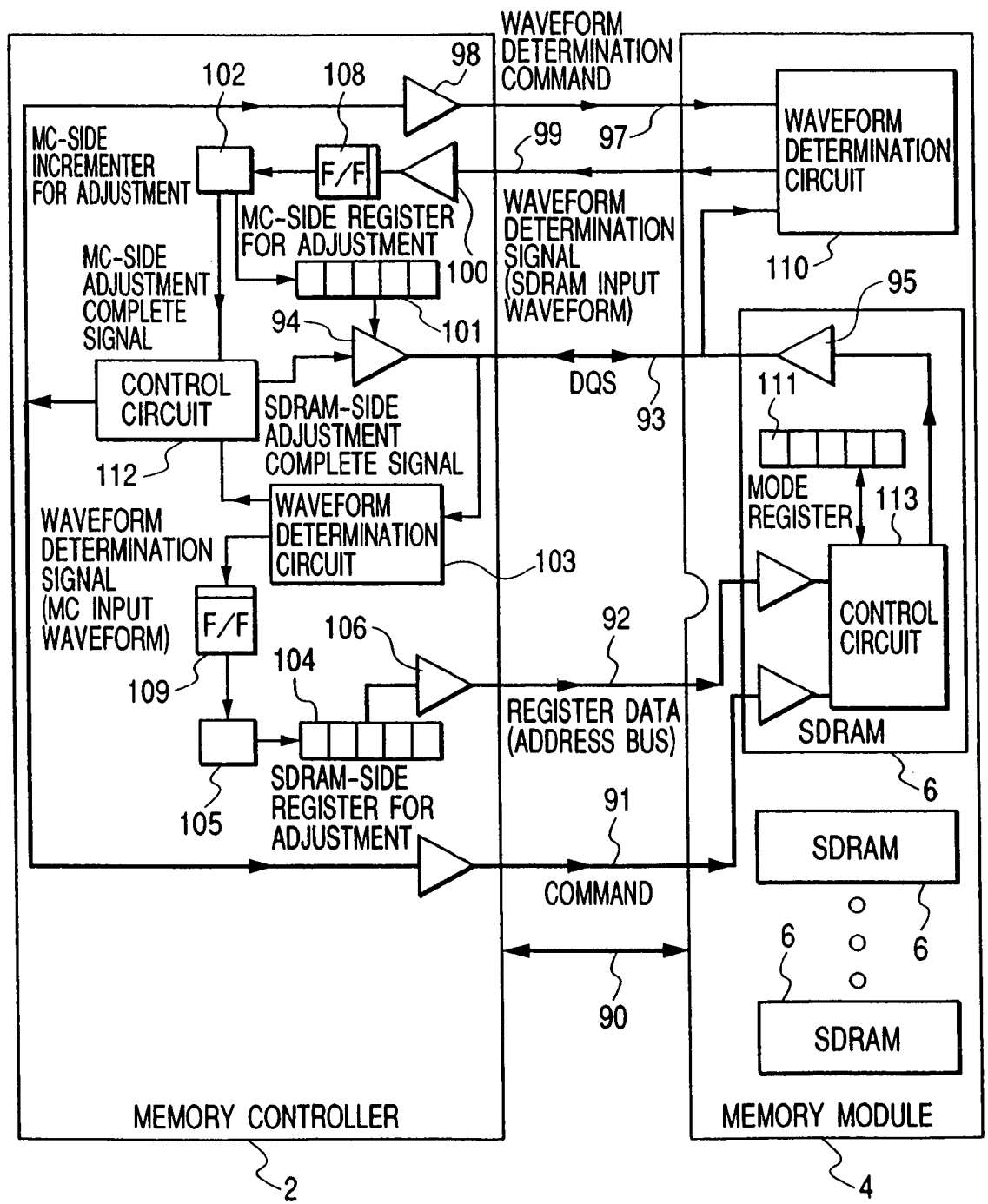
FIG. 18 is a block diagram showing an exemplary arrangement for optimizing the slew rate of the output circuits which output data strobe signals in the memory controller and the memory module.

FIG. 18 shows an exemplary configuration for optimizing the slew rates of output circuits for outputting data strobe signals DQS, in the memory controller and memory modules. In FIG. 18, the reference numeral 90 is a signal line for data, 91 is a signal line for commands, 92 is a signal line for addresses, and 93 is a signal line for the data strobe signals DQS.

The output circuits of the interest in this example are an output circuit 94 of data strobe signals DQS provided in the memory controller 2, and output circuits 95 of data strobe signals DQS provided in the SDRAMs 6. In this diagram, one output circuit 95 is representatively illustrated for one SDRAM. The output circuits 94 and 95 are configured in the same manner as the output circuit 14 in FIG. 6, in which the slew rates can be variably set according to the selection state of dumping resistances constituted by MOS transistors M11-M15 and M21-M25 respectively.

The memory module 4 at the nearest end from the memory controller 2 has a waveform determination circuit 110. The input of the waveform determination circuit 110 is connected to a pin which is most distant from the stub among the pins for the data strobe signal DQS of the SDRAM 6.

Figure 19A:
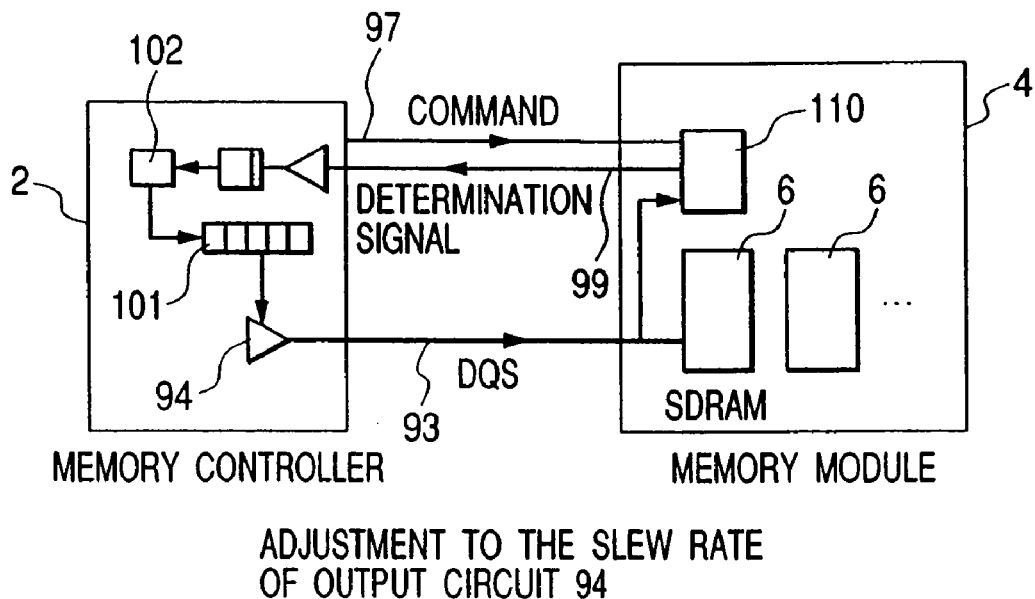
FIGS. 19A and 19B are block diagrams illustrating exemplary slew rate setting operations by waveform determination.

The outline of the slew rate setting function by waveform measurement will be first explained. In the slew rate setting operation of the output circuit 94, the waveform of a data strobe signal DQS outputted from the circuit is determined by the waveform determination circuit 110 on the side of the memory module 4, and this determination result is returned to the memory controller 2 as a waveform determination signal 99, and this signal, via a latch circuit 108 and an incrementer 102, updates the value in a register 101 to alleviate the slew rate. By repeating the above processes until the fluctuation in the waveform is no longer detected, the slew rate of the output circuit 94 is optimized according to the implementation condition for the signal line 93. More specifically, the controlling circuit 112 of the memory controller 2, as one process in i.e. power-on reset operation, controls the output circuit 94 to output a data strobe signal DQS as a test signal, and the output circuit 98 to output a waveform determine command 97. The waveform determination circuit 110 in response to this command performs the waveform determination over the inputted data strobe signal DQS. If, for example, fluctuation in the waveform is detected, the waveform determination signal 99 is changed in pulse. This pulse change is latched by the latch circuit 108, and the incrementer 102 which receives the pulse change as an increment pulse performs increment action. The counter value of the incrementer 102 is designated as a setting data for the register 101, determining the slew rate of the output circuit 94. The controlling circuit 112 detects the completion of the slew rate adjustment by having the output circuit 94 to perform the output action and detecting the counter value obtained by the incrementer 102 as being identical to the previous value. This mode of operation is outlined in FIG. 19A, and one example of the operation timing thereof is shown in FIG. 20.

Figure 19B:
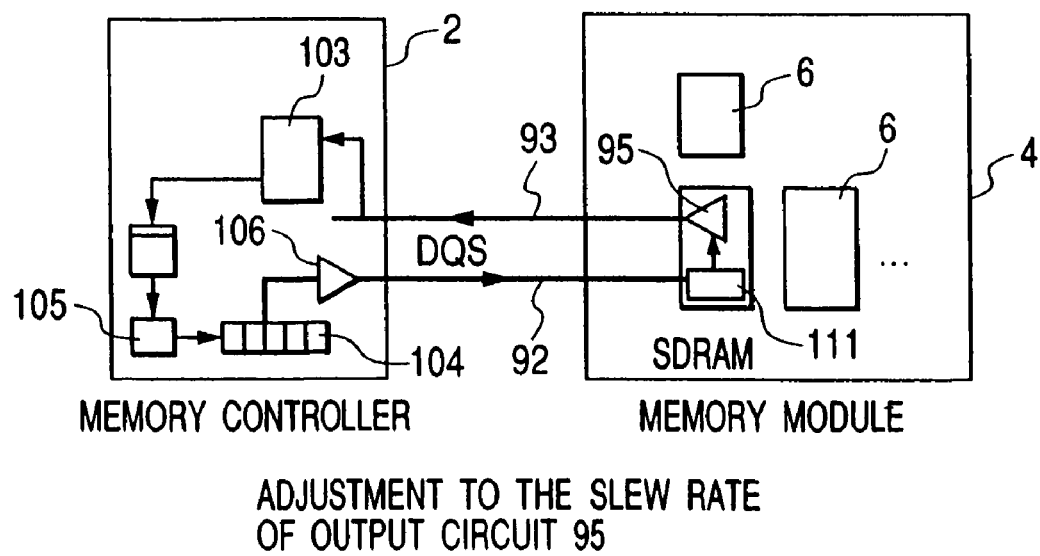

The slew rate setting operation of the output circuit 95 is instructed to a controlling circuit 113 of the SDRAM 4 by the controlling circuit 112 through a command via the signal line 91. The waveform of a data strobe signal DQS outputted by the output circuit upon this instruction is determined by a waveform determination circuit 103 on the side of the memory controller 2. The determination result is not directly returned to the SDRAM 6 via a dedicated signal line as in the previous case, but is used to update the value of the data register 104 for the slew rate adjustment of the output circuit 95 via a latch circuit 109 and an incrementer 105. The value of the register 104 is fed to a mode register 111 of the SDRAM 6 from an output circuit 106 through the address signal line 92, and under the control of the controlling circuit 113, is used to change the selection states of the dumping resistances of the output circuit 95 so as to alleviate the slew rate. By repeating the above operation until the fluctuation in the waveform is no longer detected, the slew rate of the output circuit 95 is optimized according to the implementation condition for the signal line 93. This mode of operation is outlined in FIG. 19B, and one example of the operation timing thereof is shown in FIG. 21.

The completion of the slew rate adjustment of the output circuit 95 is acknowledged by the controlling circuit 112 upon the detection of a state where the fluctuation is not detected in the waveform by the waveform detection circuit 103. The operations of the latch circuit 109 and the incrementer 105 are the same as those of the latch circuit 108 and the incrementer 102.

Figure 22:
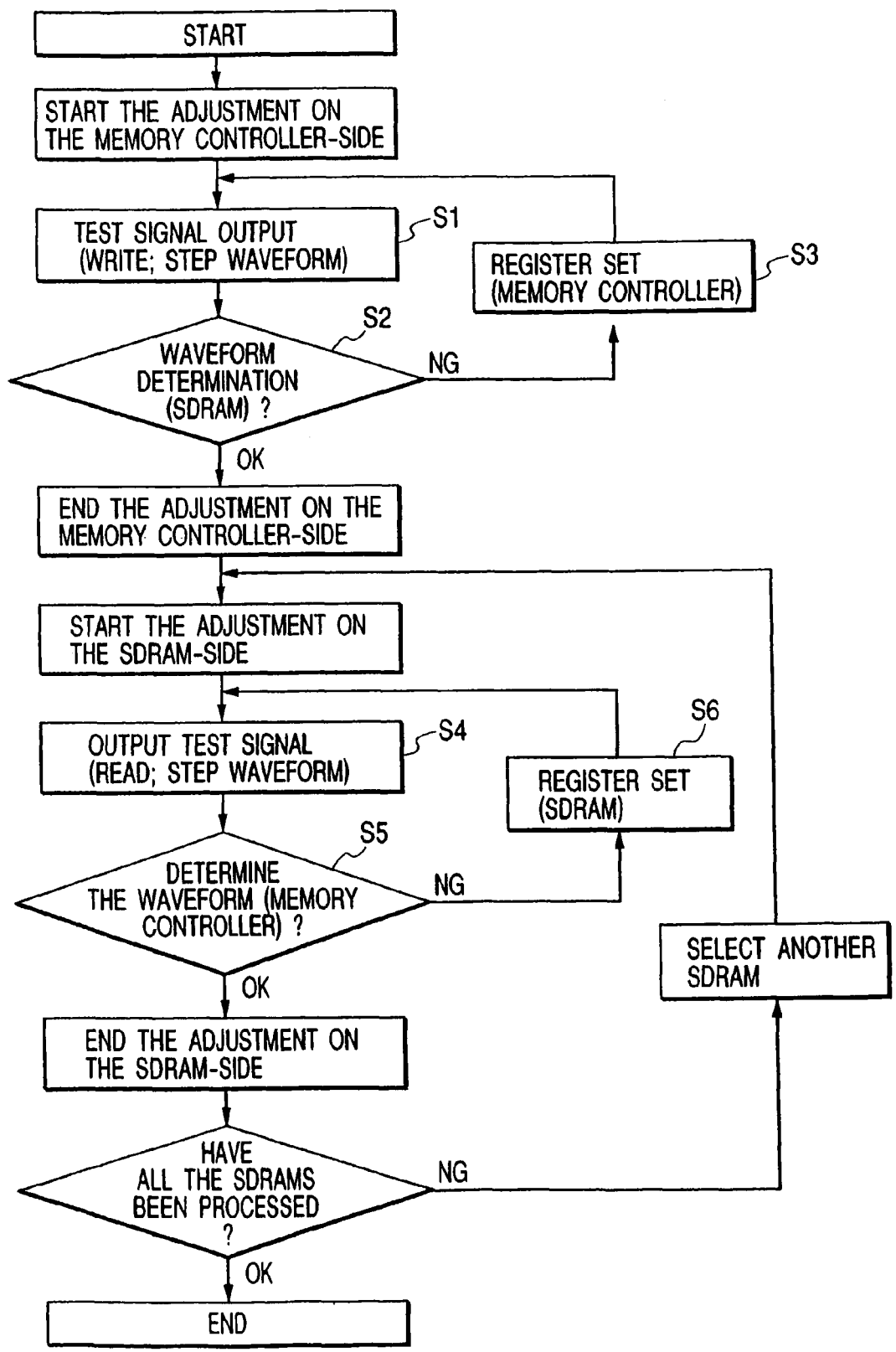
FIG. 22 is a flow chart explaining the operations of the memory controller and memory modules for determining the slew rate of the output circuits.

FIG. 22 shows a flow chart of the operations of the memory controller and the memory modules for determining the slew rates of the output circuits.

First, a data strobe signal DQS is outputted from the memory controller 2 as a test signal (S1). Next, the waveform determination is performed on the side of memory module 4 (S2). When there is no fluctuation in the waveform (OK) at this time, then the slew rate adjustment on the side of the memory controller 2 is terminated. When there is a fluctuation in the waveform (NG), then the value of the register (MC-side adjustment register) 101, which adjusts the dumping resistances, is incremented (S3), and returns to the test signal outputting step (S1). These steps are repeated until the waveform is determined to have no fluctuation. Next, the SDRAM 6 outputs a data strobe signal DQS as a test signal (S4). This is instructed by a test command given to the SDRAM 6 from the memory controller 2. Thereafter, the waveform determination is performed on the side of the memory controller 2 (S5). When there is no fluctuation in the waveform (OK) at this time, then the slew rate adjustment on the side of the SDRAM 6 terminates. When a fluctuation is detected in the waveform (NG), then the value of the register 104 is incremented by the incrementer 105 in the memory controller 2 (S6), and returns to the test signal outputting step (S4). These steps are repeated until the waveform is determined to have no fluctuation. The above steps are performed for all of the SDRAMs.

In the above steps, the clock signal CLKn is a dedicated clock signal which is a 1/n frequency division of the system clock CLK. "n" is a natural number equal to or greater than "2", and it should be a value which allows the cycle time of the clock CLKn to be as large as possible, but to the extent where the variability in the signal timing and wiring delay due to ringing would not cause problems. For example, when the system clock CLK is 200 MHz (=5 ns), 40 MHz (=25 ns) is used as the dedicated test clock signal CLKn.

Figure 23:
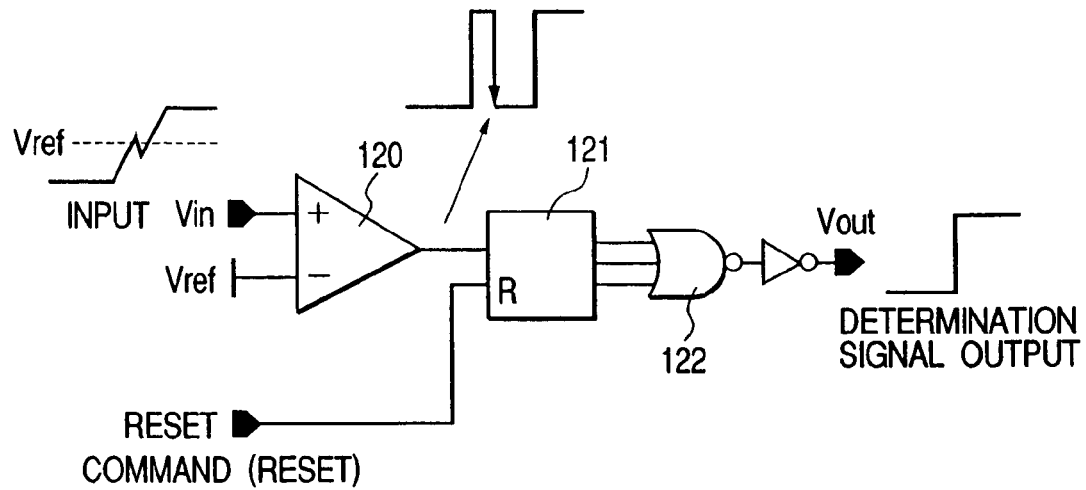
FIG. 23 is a schematic logic circuit diagram showing an exemplary waveform determination circuit.

FIG. 23 shows an exemplary waveform determination circuit. The waveform determination circuit illustrated in the figure comprises an amplifier 120 having an input for receiving a reference voltage Vref, a counter 121 and a NOR gate 122. The amplifier 120 amplifies the hazards (rising and falling variations in the voltage) around the reference voltage Vref up to the power-source amplitude, converts those hazards and outputs them as pluses. The counter 121 counts the number of the pulses. The all bits of the output of the counter 121, after being reset, are set to logic value "0". When the count value is 1 or greater, then the determination signal output Vout is inverted to the high level to indicate the presence of fluctuation in the waveform.

Figure 24:
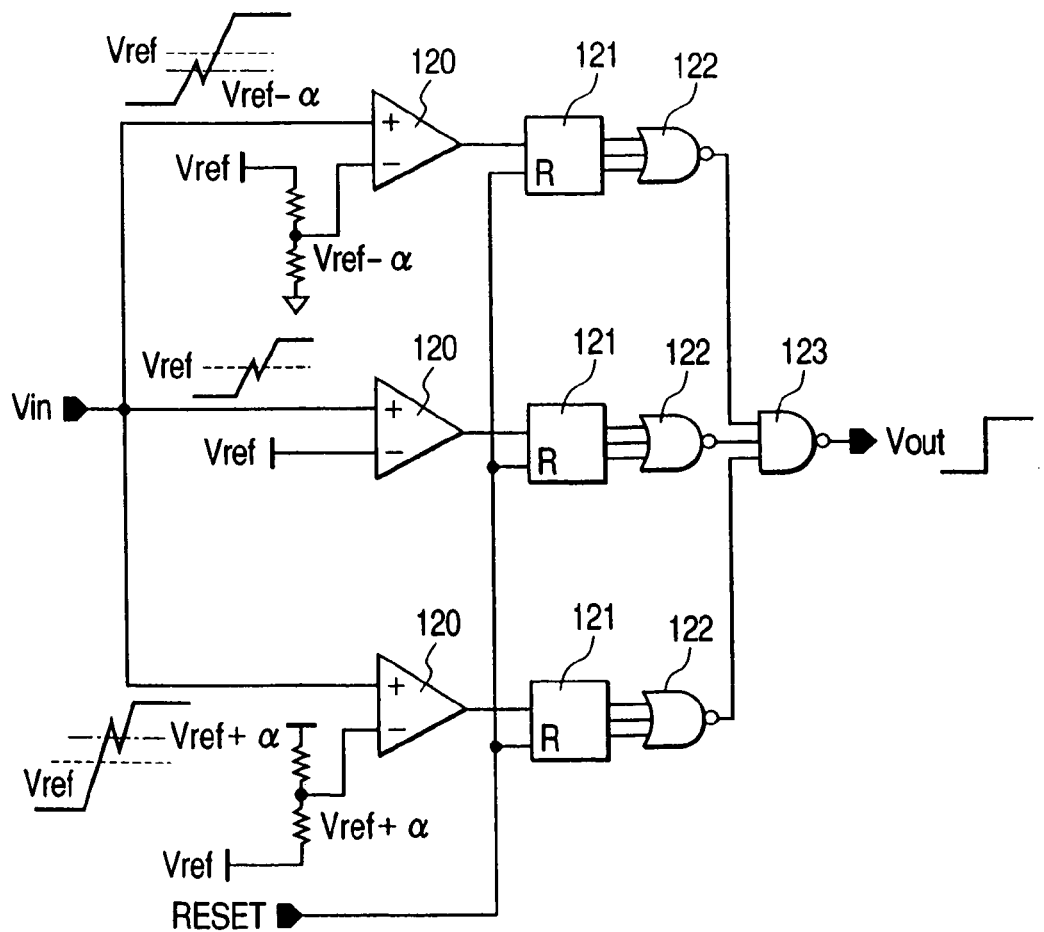
FIG. 24 is a schematic logic circuit diagram showing another exemplary waveform determination circuit.

In FIG. 24, there are three sets of the amplifiers 120, counters 121 and NOR gates 122, and different reference voltages Vref−.alpha., Vref and Vref+.alpha. are inputted to the respective amplifiers 120. In this manner, three types of hazards may be detected, and when either one of the hazards is detected, the output of a NOR gate 123 which receives the outputs of the respective NOR gates 122, is inverted to the high level, so that the detection of the fluctuation in the waveform may be indicated.

Figure 25:
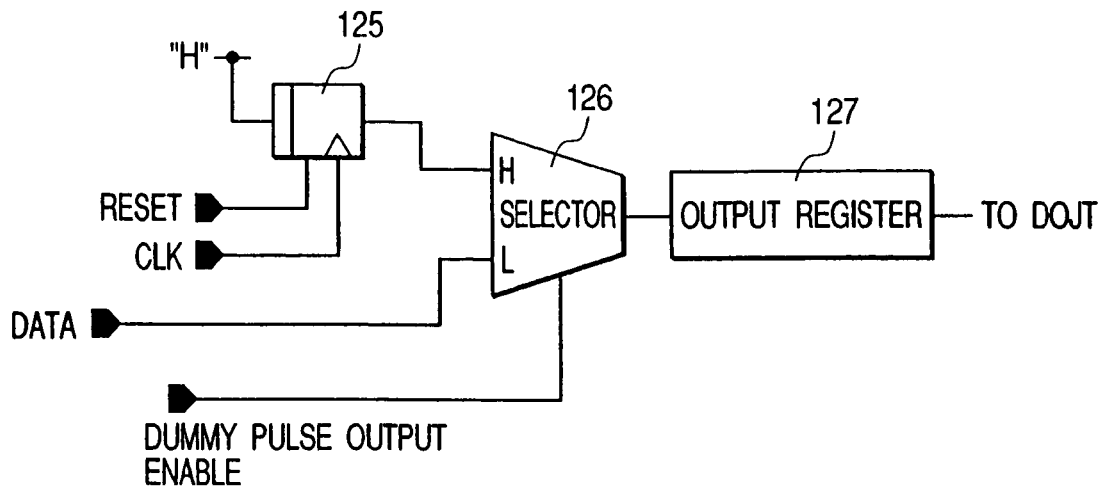
FIG. 25 is a schematic logic circuit diagram of a circuit which enables test signals to be outputted from the output circuit.

FIG. 25 shows an exemplary circuit which enables an output circuit to output a test signal. When located on the side of the memory controller 2, the circuit in this figure forms a part of the controlling circuit 112 of the memory controller 2 to output the signal DOJT to the output circuit 94, and when located on the side of the SDRAM 6, it forms a part of the controlling circuit 113 of the SDRAM 6 to output the signal DOJT to the output circuit 95.

The circuit shown in this diagram comprises a flip-flop circuit 125, a selector 126 and an output register 127. The flip-flop 125 is turned into the low level output state by a reset signal RESET, but upon the next change in the clock signal CLK, it is inverted to the high level output state. When a test signal output enable signal TSE is turned into the high level, the selector 126 selects the output from the flip-flop 125, and supplies to the output register 127. Consequently, a signal changing from the low to high level is sent to the data output circuit, so that a data strobe signal is outputted as a test signal. During normal operation, the test signal output enable signal TSE is held at the low level, so as that data strobe signals DQS generated at the timing required for the normal operation are selected.

As described in the above, since waveform fluctuations are detected at signal receiving ends, and the slew rates of the output circuits 94 and 95 are alleviated until the waveform fluctuations are eliminated, the slew rates suitable for the conditions of the implementation can be obtained, and the highly reliable data transmission may be achieved.

Figure 26:
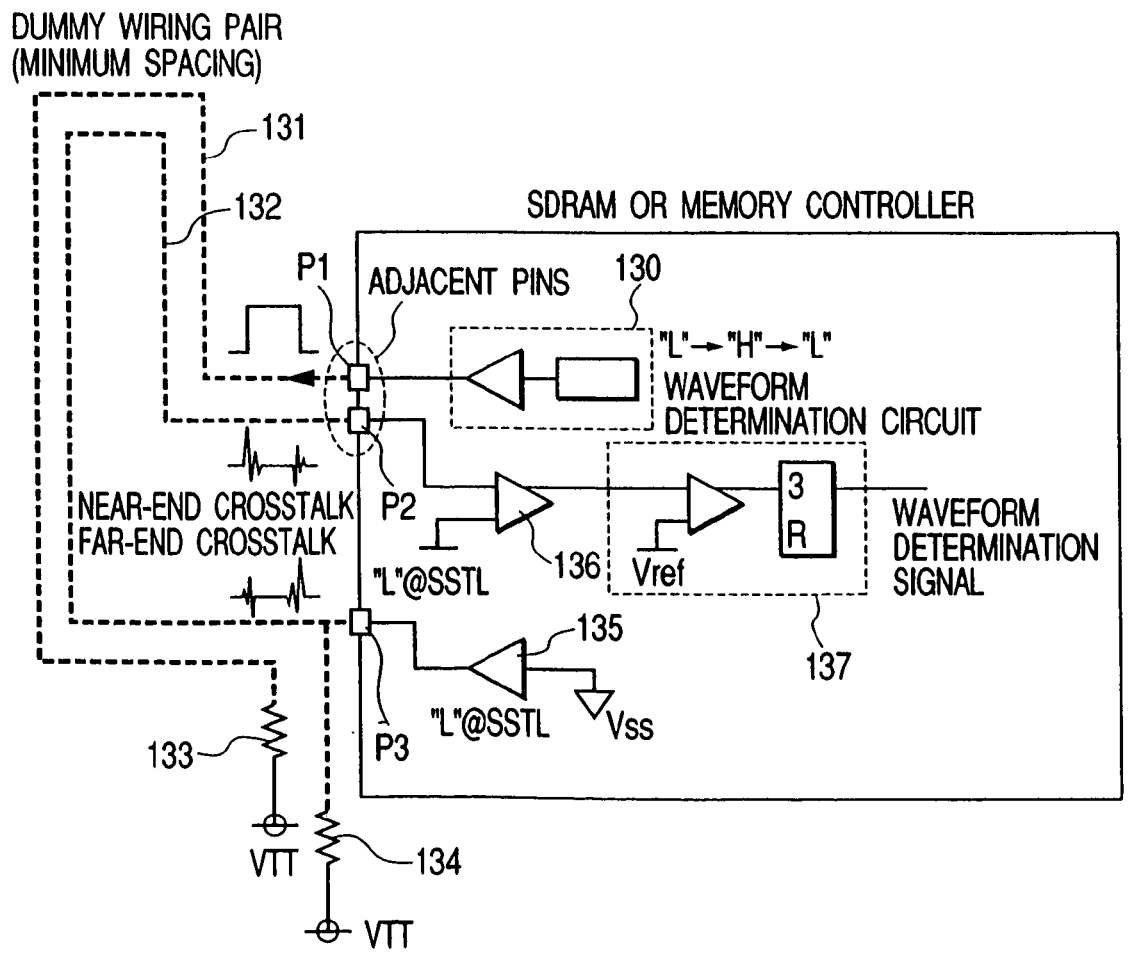
FIG. 26 is a block diagram showing an example in which the slew rate of the output circuit may be set by measuring crosstalk.
Figure 27:
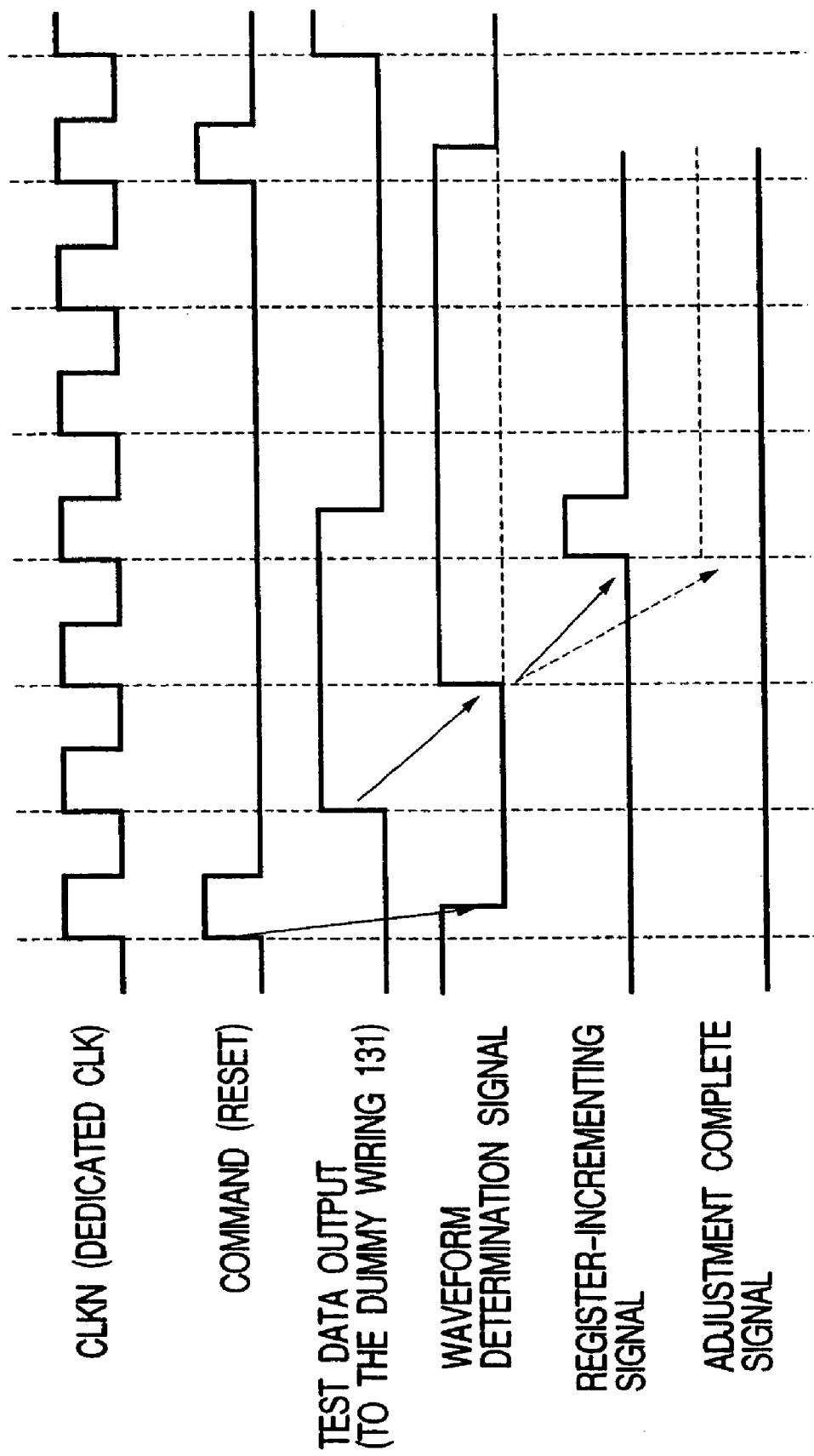
FIG. 27 is a timing chart showing an exemplary operational timing of the circuit shown in FIG. 26.

FIG. 26 shows an embodiment where the slew rate of an output circuit can be variably set through the measurement of crosstalks. FIG. 27 shows an exemplary operation timing of the circuit of FIG. 26. In the previous example, the fluctuation of waveform was measured on the actual wiring connecting the memory controller 2 and the SDRAM 6, but in the embodiment of FIG. 26, the output signals outputted by the SDRAM 6 and the memory controller 2 themselves are adapted to be susceptible to the influence of crosstalks, and these signals are fed back to them. The same configurations may by employed for both the memory controller 2 and the SDRAM 6.

A signal waveform subject to the influence of the crosstalk is generated by the use of a pattern generating circuit 130 and dummy wirings 131 and 132. The dummy wiring 131 and 132 are parallel wirings connected to pins P1 and P2 adjacent to each other, where the spacing between the pins is set to a minimum value allowable in terms of implementation rules relevant to signal lines, so as that crosstalks can be detected easily. The other end of the dummy wiring 131 is terminated by a termination resistance 133. The ends of the dummy wiring 132 are connected to pins P2 and P3 respectively, but the pin P3, which is at the opposite end from the pin P2 adjacent to the pin P1 of the dummy wiring 131, is terminated with a termination resistance 134. The pin P3 is fed with a constant signal at the low level supplied from an output circuit 135 provided within a semiconductor integrated circuit such as the SDRAM 6 or the memory controller 2 etc.

The pattern generating circuit 130 outputs a signal of "L"-"H"-"L" from the pin P1 to the dummy wiring 131. At this time, the pin P2 adjacent to the pin P1 is affected by the near-end crosstalk of the signal outputted to the dummy wiring 131. The pin P2 is connected to a waveform determination circuit 137 via an input buffer 136 within the semiconductor integrated circuit, so that the hazard waveform caused by the near-end crosstalk is detected. Also, by replacing the pin P2 for the waveform determination and the pin P3 for fixing the output to "L" level, the hazard waveform caused by a far-end crosstalk may be detected. Since the configuration of the waveform determination circuit 147 as well as those of the other components are similar to the configurations in the previous example, further detailed description will be omitted herein.

According to the configuration of FIG. 26, the slew rate of the output circuit can be set automatically so as to alleviate the influence of crosstalks, and to prevent malfunctioning caused by such crosstalks etc.

<Slew Rate Optimization by Data Error Detection>

An example where the slew rate optimization is achieved by detecting data errors will now be explained, taking the electronic device of FIG. 3 as an example.

Figure 28:
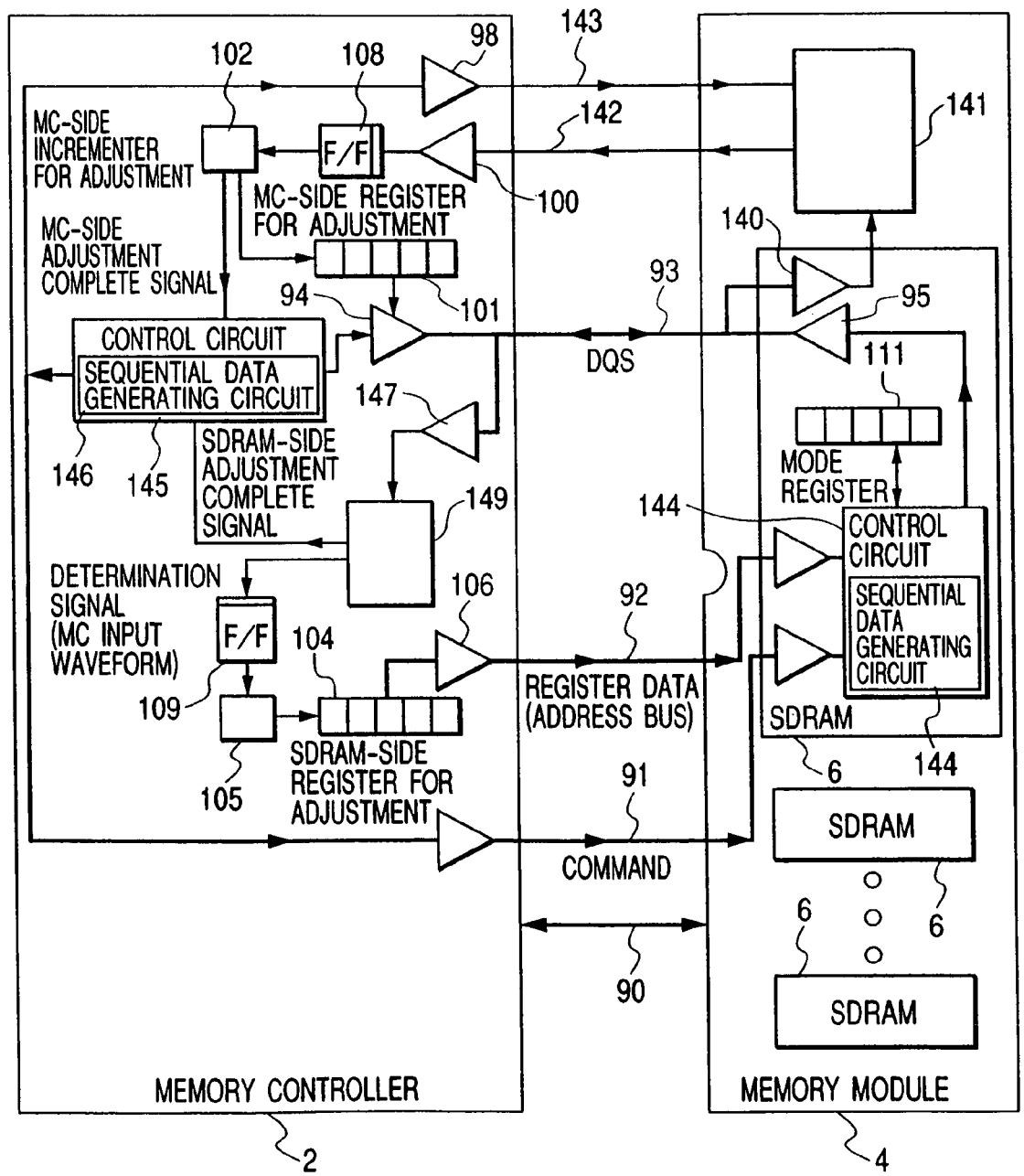
FIG. 28 is a block diagram showing another exemplary arrangement for optimizing the slew rates of the output circuits which output data strobe signals in the memory controller and the memory modules.

FIG. 28 shows an exemplary configuration similar to that in FIG. 18 for optimizing the slew rate of an output circuit which outputs data strobe signals DQS in the memory controller or memory module. In the configuration of FIG. 18, the waveform fluctuation was detected in an analog fashion, however, in the example of FIG. 28, the determination is digitally made on the presence or absence of data errors in a transmitted data pattern. Herein, only those circuit elements that differ from the example of FIG. 18 will be explained, and those circuit elements having the identical functions as those in FIG. 18 are referred by the same reference numerals, and the detailed explanation will be omitted.

The output circuit of the interest in this example is the output circuit 94 of data strobe signals DQS provided in the memory controller 2, and the output circuit 95 of data strobe signals DQS provided in the SDRAM 6. In this diagram, one output circuit 95 is representatively illustrated for one SDRAM. The output circuit 94 and 95 are configured in the same way as the output circuit 14 of FIG. 6, and their slew rates are variably set according to the selection states of dumping resistances constituted by MOS transistors M11-M15 and M21-M25 respectively.

Figure 29A:
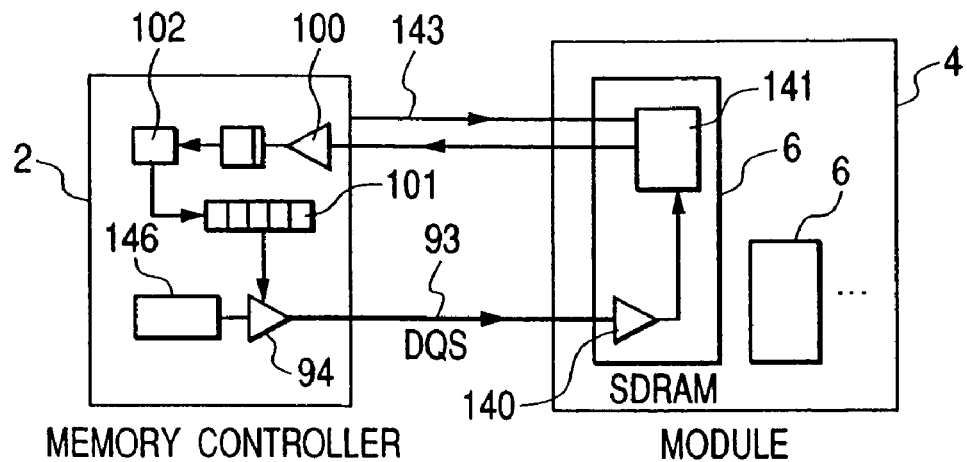
FIGS. 29A and 29B are illustrative diagrams showing the slew rate setting operation of the output circuit.
Figure 30:
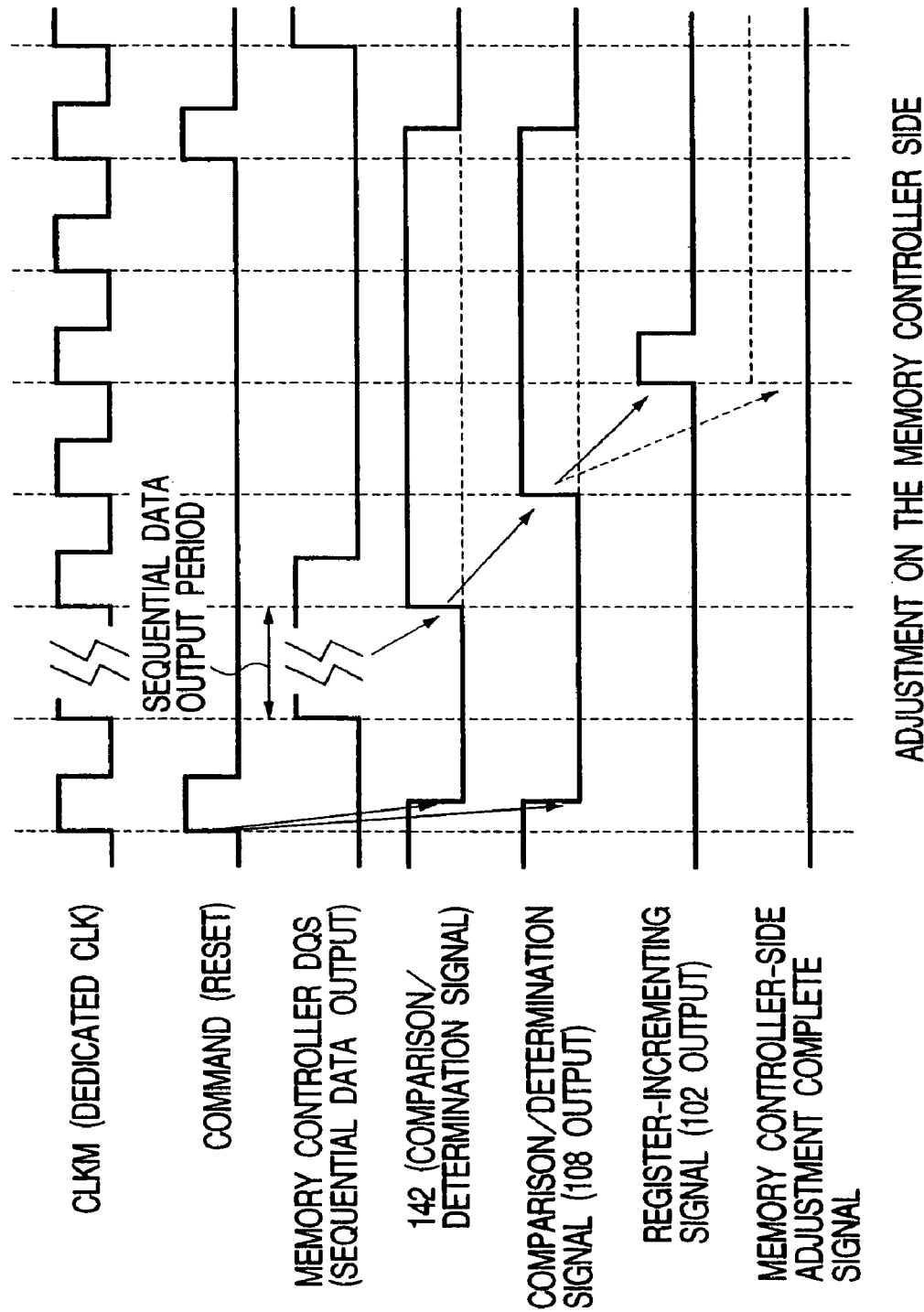
FIG. 30 is a timing chart showing an exemplary slew rate setting operation on the memory controller side.

In the slew rate setting operation for the output circuit 94, a sequential pattern generated by a sequential data generating circuit 146 included in a controlling circuit 145 is outputted from the output circuit 94 to the signal line 93, and the data outputted is received by an input buffer 140. A determination circuit 141 on the side of the memory module 4 determines the presence or absence of data errors, and the result thereof is returned to the memory controller 2 as a comparison/determination signal 142 which updates the value in a register 101 via a latch circuit 108 and an incrementer 102 to alleviate the slew rate of the output circuit 94. By repeating the above steps until data errors can no longer be detected, the slew rate of the output circuit 94 is optimized according to the implementation condition for the signal line 93. The controlling circuit 145 of the memory controller 2, as a part of the processes in the power-on reset operation for example, controls the output circuit 94 to output the test pattern data, and output circuit 98 to output a compare/determine command 143. In response to this command, the determination circuit 141 determines the presence or absence of the data errors. To determine the data errors, the determination circuit 141 may include, i.e. a circuit to generate a data pattern identical to the data pattern generated by the controlling circuit 145 as a reference data to compare the data pattern received through the signal line 93 with that reference data, and to determine the presence or absence of data errors. This mode of operation is schematically illustrated in FIG. 29A, and an example of the operation timing thereof is shown in FIG. 30.

Figure 29B:
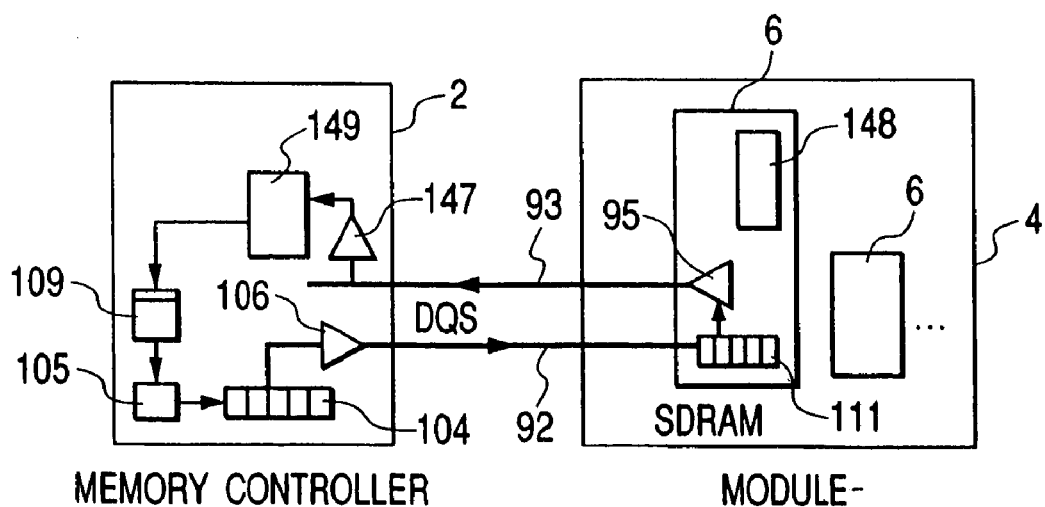
Figure 31:
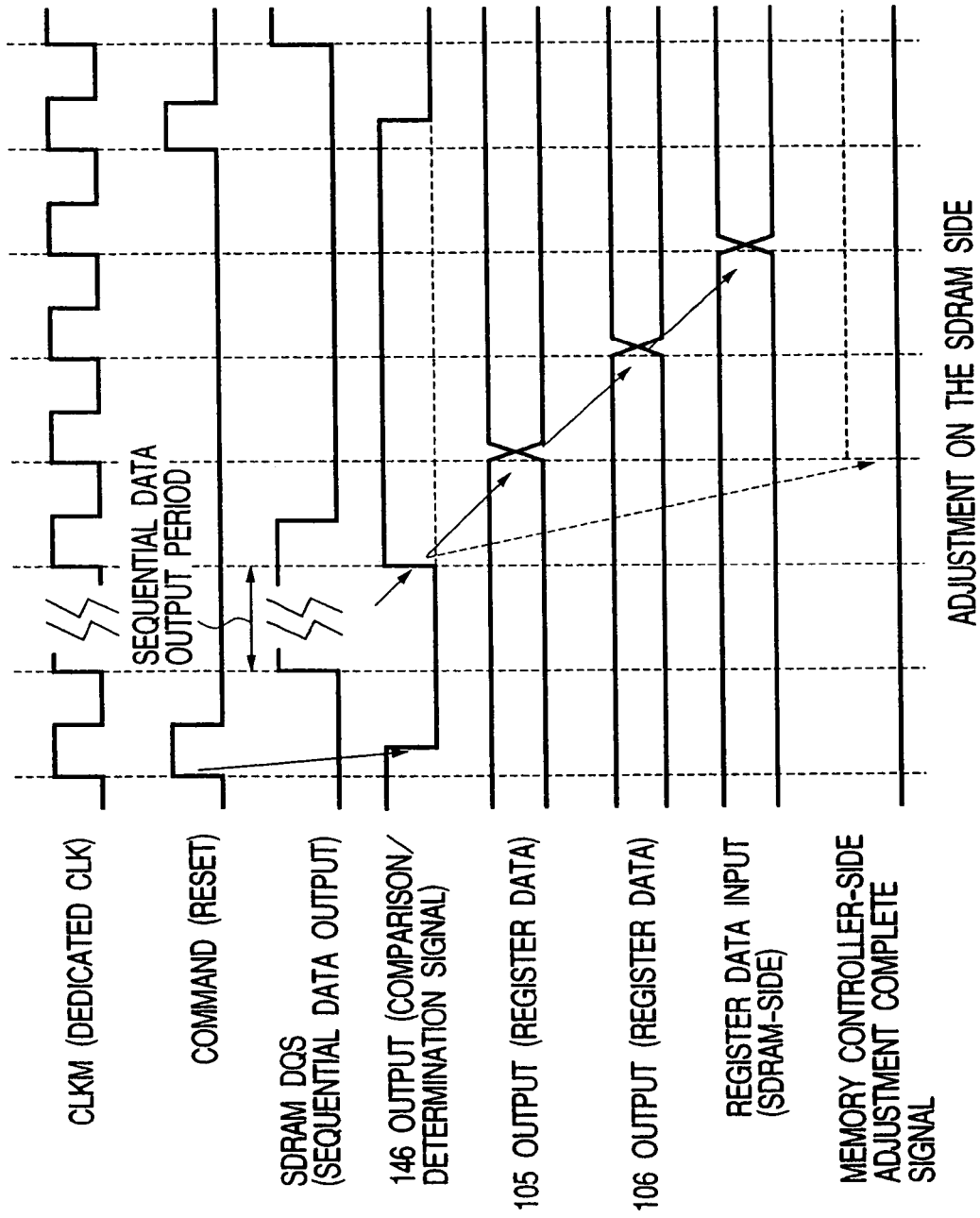
FIG. 31 is a timing chart showing an exemplary slew rate setting operation on the SDRAM side.

The slew rate setting operation of the output circuit 95 is instructed by the controlling circuit 145 with a command to a controlling circuit 144 of an SDRAM 4 through the signal line 91. Upon this instruction, a sequential data generating circuit 148 within the controlling circuit 144 serves to have a sequential pattern data outputted via the output circuit 95 to the signal line 93. The outputted sequential pattern data is inputted to a determination circuit 149 via an input buffer 147 on the side of the memory controller 2. The determination circuit 149 determines whether or not the inputted data includes data errors. To determine such data errors, as previously explained, the determination circuit 149 may include, for example, a circuit for generating a data pattern identical to the data pattern generated by the controlling circuit 144 as the reference data and the signal line 93 to be compared with the received pattern data to determine the presence or absence of data errors. The determination result is not directly returned to the SDRAM 6 via a dedicated signal line as in the previous case, but sent to a slew rate adjustment data register 104 for the output circuit 95 to update the value therein via the latch circuit 109 and the incrementer 105. The value in the register 104 is fed to the mode register 111 of the SDRAM 6 via the address signal line 92 from the output circuit 106, and used to change the selection state of dumping resistances of the output circuit 95 under the control of the controlling circuit 144 to alleviate the slew rate. By repeating the above steps until the data errors are not detected, the slew rate of the output circuit 95 is optimized according to the implementation condition for the signal line 93. This mode of operation is schematically illustrated in FIG. 29B, and an example of the operation timing thereof is shown in FIG. 31.

Figure 32:
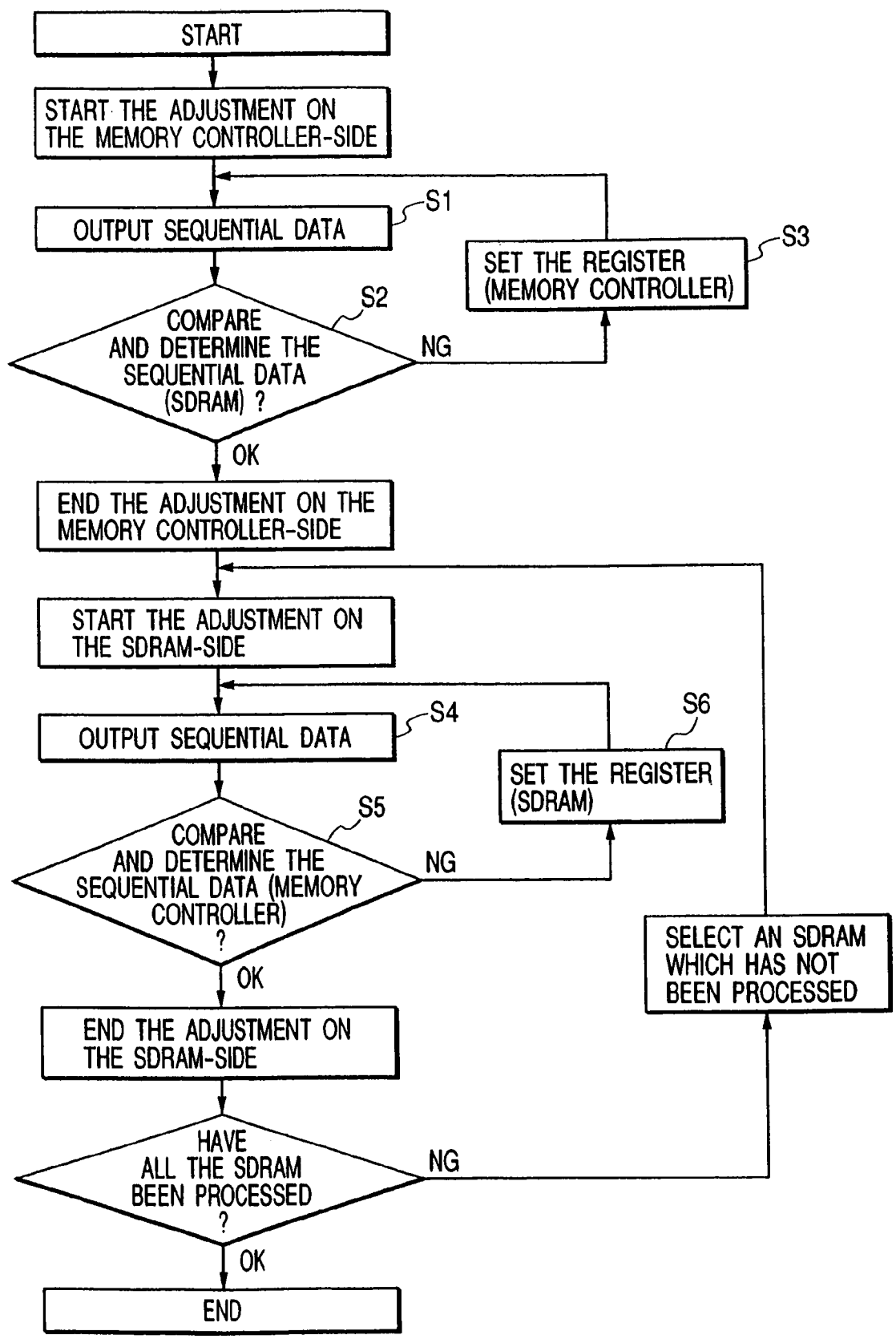
FIG. 32 is a flow chart showing an exemplary operation of the memory controller and the memory modules for determining the slew rates of the output circuits shown in FIG. 28.

FIG. 32 shows a flow chart of the operation of the memory controller and the memory module for determination of the slew rate of the output circuits.

First, a given sequential data is outputted from the memory controller 2 (S1). Next, the comparison of the sequential data is performed on the side of the SDRAM 6 (S2). When there is no errors in the received sequential data (OK) at this time, then the slew rate adjustment on the side of SDRAM is terminated, and when there is an error in the received data (NG), then the register 101 for adjusting the dumping resistances is incremented so as to alleviate the slew rate (S3), then the process returns to the data pattern outputting step (S1). The above steps are repeated until the received sequential data is determined to have no errors.

Thereafter, a given sequential pattern data is outputted from the SDRAM 6 (S4). This is done by sending a sequential data send command from the memory controller 2 to the SDRAM 6. The sequential data received on the side of the memory controller 2 is compared and determined (S5). If there is no error in the received data (OK) at this time, then the slew rate adjustment on the side of the SDRAM 6 is terminated, and when there is an error in the received data (NG), then the value in the register 104 within the memory controller 2 is incremented so as to alleviate the slew rate (S6), and the process returns to the pattern data outputting step (S4). The above steps are repeated until the received sequential data is determined to have no errors. The slew rate setting steps for the SDRAM are performed for all of the SDRAMs 6. This operation may be performed more efficiently by performing these steps module by module, using one SDRAM 6 in each of the memory modules as a representative, instead of performing the steps over all the individual SDRAMs 6 one by one.

Figure 33:
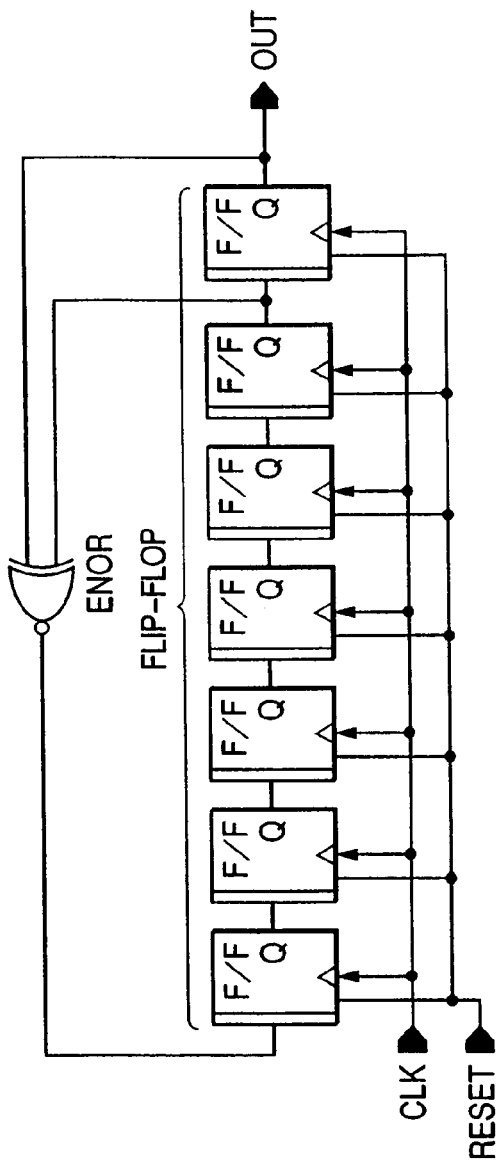
FIG. 33 is a schematic logic circuit diagram showing an exemplary sequential data generating circuit.
Figure 34:
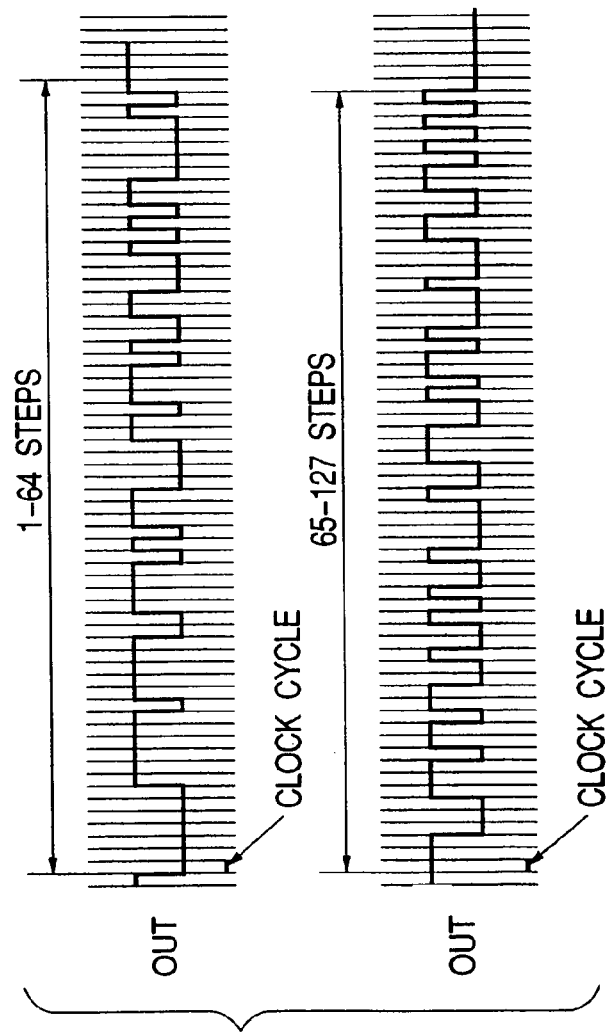
FIG. 34 is an illustrative diagram of pseudo-random patterns generated by the circuit shown in FIG. 33.

FIG. 33 shows an exemplary sequential data generating circuit. The example shown in the figure is a 7-bit M-series generator which repetitively generates pseudo-random patterns comprising 127 steps in synchronization with the clock CLK as shown in FIG. 34.

Figure 35:
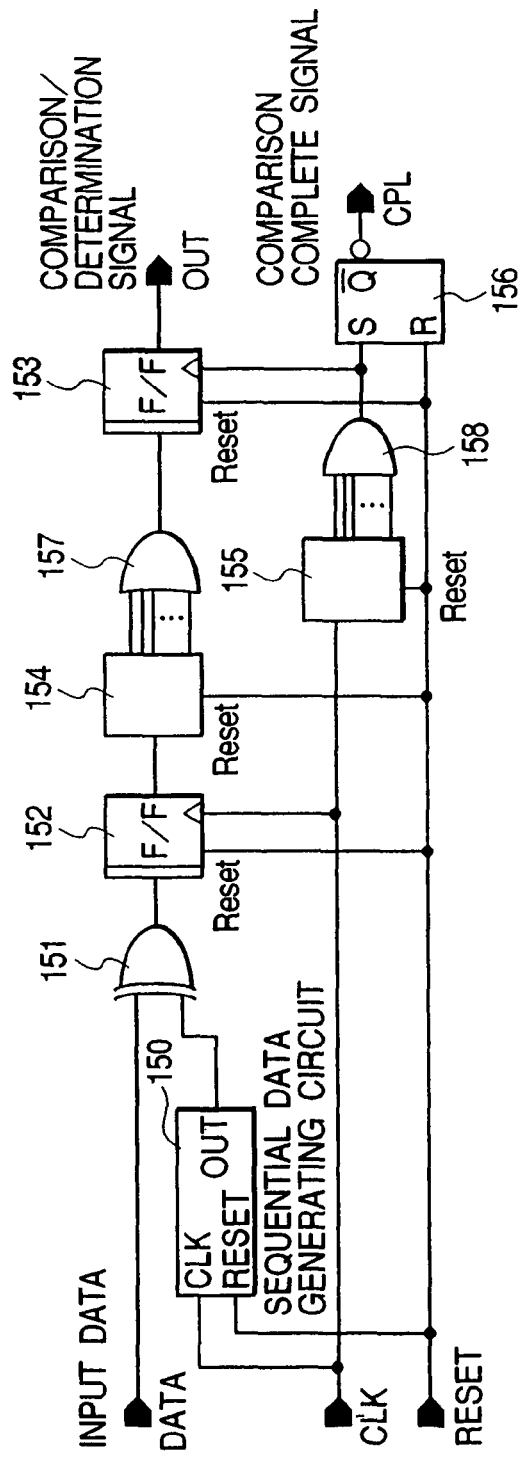
FIG. 35 is a schematic logic circuit diagram showing one example of a sequential data comparison circuit which is a part of the determination circuit.

FIG. 35 shows an example of the sequential data comparison circuit which constitutes the determination circuit 141 or 149. This circuit comprises the sequential data generation circuit 150, an EXCLUSIVE OR gate 151, flip-flops 152, 153, 7-bit counters 154, 155, an SR latch circuit 156, a 7-input OR gate 157, and a 7-input AND gate 158. The sequential data generating circuit 150 has the same circuit configuration as the 7-bit M-series generator shown in FIG. 33.

When a positive pulse is inputted to a reset pin RESET, the sequential data comparison circuit of FIG. 35 compares, within the EXCLUSIVE OR gate 151, the sequential data inputted to a data pin DATA in synchronization with the clock signal CLK with the sequential data generated by the sequential data generating circuit 150, and fetches the comparison result by the flip-flop 152 in synchronization with the clock. A mismatch of the comparison result by the EXCLUSIVE OR gate 151 results in a high-level output from the flip-flop 152. The counter 154 counts the number of these pulses. Accordingly, when one or more data mismatch is detected, the output of the OR gate 157 is inverted to the high level. This represents the sequential data comparison result in the steps received up to that point. The counter 155 counts all steps (127 steps) of the sequential data, and after reception of all the steps, the output of the AND gate 158 on the next stage turns into the high level. By this, the output of the OR gate 157 at that time is latched by the flip-flop 153, and the latched signal is designated as a comparison/determination signal, and the change of the signal CPL outputted by the SR latch 156 into the high level indicates the termination of the sequential data comparison operation.

As explained in the above, the sequential data reception test allows to detect the presence or absence of data reception errors at the signal receiving end of a transmission line included in an implementation, and the slew rate is controlled to be alleviated until the errors in the received data is no longer detected, therefore, the occurrence of ringing can be reduced or suppressed according to the condition of the implementation, and highly reliable data transmission may be performed.

Figure 36:
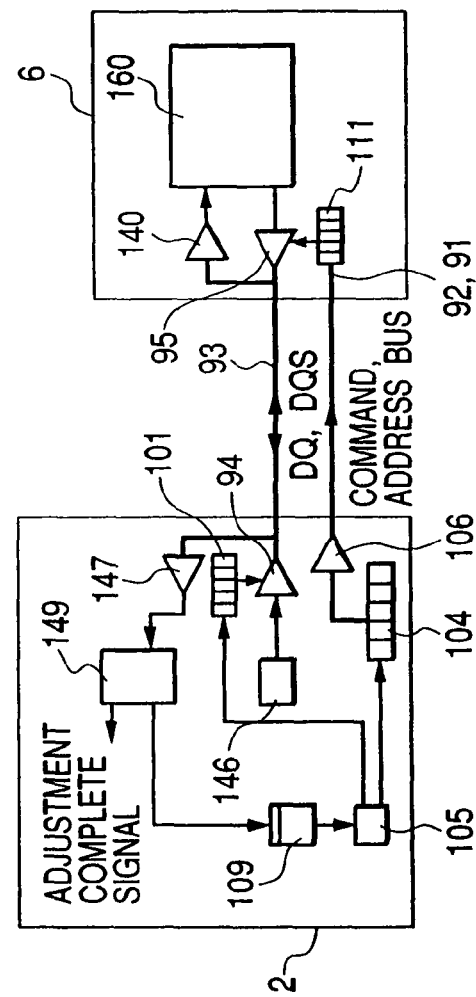
FIG. 36 is a block diagram showing an example where the memory function of the SDRAM is diverted as the sequential data generating circuit.

FIG. 36. shows an example wherein the memory function of the SDRAM is utilized also as the sequential data generating circuit. In the diagram, the reference numeral 160 is a functional module, generally representing a memory cell array and controlling circuitry of the SDRAM 6. When a sequential data is sent from the memory controller 2 to the SDRAM 6 in order to set the slew rate of the output circuit 94 of the memory controller 2, a memory write command is used as the sequential data comparison command. Thereafter, the data written in the SDRAM 6 is read by the memory controller 2 in a speed slower than the actual data transmission rate, in other words, in a speed which would not cause data errors, and the read data is compared with a reference data by the determination circuit 146 for the data error determination.

When the sequential data is sent from the SDRAM 6 to the memory controller 2 in order to set the slew rate of the output circuit 95 of the SDRAM 6, a read command is used as the sequential data comparison command. The data read from the SDRAM 6 is compared with a reference data by the comparison circuit 146 to determine the presence or absence of data errors. When the sequential data generation from the side of the SDRAM 2 is performed in this way, the sequential data written to the SDRAM during the previous test is read out from the memory cell array and fed to the memory controller, and the data error determination is performed in the memory controller 2. In this way, the sequential data generating circuit and data error determination circuit may be unnecessitated for the SDRAM 6.

Since the existing signal line for commands such as RAS, CAS and WE and address signal line are used as the signal line for the sequential data comparison command from the memory controller 2 to the SDRAM 6 (that is, the lines are turned into the sequential data comparison mode by the mode register setting), and since the data (DQ) signal line is used (shared) as the signal line for the sequential data comparison/determination signal, the counts of pins and wirings can be minimized.

When performing the sequential data transmission/reception test from the memory controller 2 to the SDRAM 6, by having a microprocessor or CPU on the motherboard output pseudo-random pattern by a program, and by writing a sequential data to the SDRAM 6 using the memory controller 2, the sequential data generating circuit of the memory controller 2 may be unnecessitated, so that the required space may be further reduced.

The foregoing describes the present invention invented by the present inventor in detail according to the embodiments, however, it should be understood that the present invention is not limited to those embodiments, and various modifications are possible without significantly departing from the principle of the present invention.

For example, the semiconductor integrated circuit is not limited to an SDRAM or memory controller. It may be another type of semiconductor integrated circuit such as another type of memory, microprocessor or DMAC. The electronic device is also not limited to the one having memory modules, and it may be implemented in various types of electronic devices.

The effects obtained by the representative invention among the inventions disclosed herein may be briefly illustrated as follows.

A slew rate which alleviates the reflection at an arbitrary reflection point may be obtained by providing a dummy wiring directed to the reflection point corresponding to the target reflection to be alleviated.

Since the fluctuation of waveform (hazard) may be detected at the signal receiving end, and a slew rate which causes no waveform fluctuation is set to the output circuit, the transmission of a signal having no fluctuation at the signal receiving end is possible.

Since the transmission/reception test of a signal is performed, and a slew rate which causes no transmission/reception errors in the test data is set to the output circuit, the transmission of the signal which is not likely to exhibit the transmission/reception errors is possible.

Since a slew rate setting for an output circuit is performed in accordance with the conditions of the implementation, the stable data transmission is realized over a wide range of implementations.

By the above effects, a semiconductor integrated circuit or an electronic device is provided, which allows ringing occurred on a transmission line to be restrained according to the conditions of the implementation even when operated under a high speed with small signal amplitude. Furthermore, any errors in the timing instruction by a signal carried over a transmission line or in the determination of the logic value of a signal may be reduced regardless of the condition of the implementation.

What is claimed is:

1. An electronic device including a motherboard mounted with a memory controller and a memory module interfaced to said memory controller, mounted with a plurality of memories and, comprising: a first dummy wiring which simulates and feeds back a path from said memory to a given characteristic impedance mismatching point present along a signal wiring reaching to said memory controller; and a second dummy wiring which simulates and feeds back a path from said memory controller to a given characteristic impedance mismatching point present along a signal wiring reaching to said memory; wherein said memory includes: a first output circuit capable of variably setting signal transition time; a first signal generating circuit which generates a test signal for the use in a setting operation of said signal transition time; and a first controlling circuit which sets said signal transition time to said first output circuit based on a transmission delay time of said test signal which has been outputted from said first signal generating circuit to said first dummy wiring and fed back; and said memory controller includes; a second output circuit capable of variably setting signal transition time; a second signal generating circuit which generates a test signal for setting said signal transition time; and a second controlling circuit which sets said signal transition time to said second output circuit based on a transmission delay time of said test signal which has been outputted from said second signal generating circuit to said second dummy wiring and fed back.

2. An electronic device according to claim 1 wherein said first output circuit outputs data strobe signals for the data read out from said memory, and said second output circuit outputs data strobe signals for the output of write data.

3. An electronic device including a motherboard mounted with a memory controller and a memory module mounted with a plurality of memories interfaced with said memory controller through a connector comprising: a first dummy wiring which simulates and feeds back a signal wiring path from said memory controller to said memory; and a second dummy wiring which simulates and feeds back a signal wiring path from said memory controller to said connector along a signal wiring path from said memory to said memory controller; wherein said memory includes: a first output circuit capable of variably setting signal transition time; and said memory controller includes: a second output circuit capable of variably setting signal transition time; a signal generating circuit which generates a test signal for the use in a setting operation of said signal transition time; and a second controller which sets said signal transition time to said second output circuit based on a transmission delay time of the test signal which has been outputted from said signal generating circuit to said first dummy wiring and fed back; and a first controller which determines said signal transition time of said first output circuit based on a difference in transmission time between said test signal which has been outputted from said signal generating circuit to said first dummy wiring and fed back and the test signal which has been outputted from said signal generating circuit to said second dummy wiring and fed back.

4. An electronic device including a motherboard mounted with a memory controller and a memory module interfaced to said memory controller, mounted with a plurality of memories, comprising:

a plurality of signal wirings connecting between the memory controller and the memories on the motherboard, wherein at least one of the signal wirings is a dummy wiring, the memory controller outputs a test signal to the dummy wiring for setting a signal transition time, and the memory controller sets the signal transition time based on a delay time of the test signal being fed back to the memory controller by the dummy wiring.

5. The electronic device according to claim 4, wherein the dummy wiring simulates a path from the memory controller to a given characteristic impedance mismatching point along one of the signal wirings and a feed back path from the impedance mismatching point to the memory controller.

6. The electronic device according to claim 4, wherein the memory controller comprises:

a signal generating circuit which generates the test signal; and a detection circuit for detecting the signal delay time, wherein the detection circuit detects a difference between a rise time of the test signal outputted from the signal generating circuit and a rise time of the test signal returned to the memory controller by the dummy wiring.

7. The electronic device according to claim 6, wherein the memory controller further comprises a slew rate setting register, a control code being set to the slew rate setting register corresponding to the detected time difference.

8. The electronic device according to claim 4, wherein the signal wirings comprises:

a first dummy wiring which simulates a path from the memory controller to the memory and a feed back path from the memory to the memory controller; and a second dummy wiring which simulates a path from the memory controller to a connector for mounting the memory module on the motherboard and a feed back path from the connector to the memory controller.

9. The electronic device according to claim 8, wherein the memory controller sets the signal transition time to a first output circuit included in the memory based on both the delay time of the test signal being fed back to the memory controller by the first dummy wiring and the delay time of the test signal being fed back to the memory controller by the second dummy wiring.

10. The electronic device according to claim 8, wherein the memory controller sets the signal transition time to a second output circuit included in the memory controller based on the delay time of the test signal being fed back to the memory controller by the first dummy wiring.

* * * * *